(12) United States Patent
Zhou et al.

(10) Patent No.: US 9,441,106 B2
(45) Date of Patent: Sep. 13, 2016

(54) COMPOSITION, MULTILAYER SHEETS MADE THEREFROM, AND METHODS FOR MAKING AND USING THE SAME

(75) Inventors: Jian Zhou, Evansville, IN (US); Andries Jakobus Petrus van Zyl, Bergen Op Zoom (NL); Vandita Pai-Paranjape, Evansville, IN (US); Glen Robert Tryson, Malden Bridge, NY (US); Matthew Frank Niemeyer, North Chatham, NY (US)

(73) Assignee: SABIC GLOBAL TECHNOLOGIES B.V. (NL)

( * ) Notice: Subject to any disclaimer, the term of this patent is extended or adjusted under 35 U.S.C. 154(b) by 369 days.

(21) Appl. No.: 13/294,523

(22) Filed: Nov. 11, 2011

(65) Prior Publication Data

US 2013/0118581 A1    May 16, 2013

(51) Int. Cl.
| | |
|---|---|
| *C08L 69/00* | (2006.01) |
| *B29C 47/06* | (2006.01) |
| *B32B 27/06* | (2006.01) |
| *H01L 31/048* | (2014.01) |
| *B32B 27/36* | (2006.01) |
| *B32B 27/08* | (2006.01) |
| *H01L 31/049* | (2014.01) |

(52) U.S. Cl.
CPC .............. *C08L 69/00* (2013.01); *B32B 27/08* (2013.01); *B32B 27/365* (2013.01); *H01L 31/049* (2014.12); *B32B 2270/00* (2013.01); *B32B 2307/412* (2013.01); *B32B 2457/12* (2013.01); *C08L 2205/02* (2013.01); *Y02B 10/12* (2013.01); *Y02E 10/50* (2013.01); *Y10T 428/31507* (2015.04)

(58) Field of Classification Search
CPC .................................................. C08L 2205/03
USPC ................... 525/394, 397; 524/537, 539, 540
See application file for complete search history.

(56) References Cited

U.S. PATENT DOCUMENTS

| | | |
|---|---|---|
| 3,792,115 A | 2/1974 | Kishikawa et al. |
| 4,140,730 A | 2/1979 | Binsack et al. |
| 4,280,978 A | 7/1981 | Dannheim et al. |
| 4,304,899 A | 12/1981 | Mark et al. |
| 5,061,558 A | 10/1991 | Fischer et al. |
| 5,759,689 A | 6/1998 | Sieloff |
| 5,763,674 A | 6/1998 | Pickett et al. |
| 6,740,714 B2 | 5/2004 | Kratschmer et al. |
| 7,092,163 B2 | 8/2006 | Bastawros et al. |
| 7,491,788 B1 | 2/2009 | Leenders et al. |
| 7,495,064 B2 | 2/2009 | Domingo et al. |
| 7,521,119 B2 | 4/2009 | Boven et al. |
| 7,524,562 B2 | 4/2009 | Tamaki et al. |

(Continued)

FOREIGN PATENT DOCUMENTS

| | | |
|---|---|---|
| CN | 102064208 A | 5/2011 |
| EP | 1831309 B1 | 12/2008 |

(Continued)

OTHER PUBLICATIONS

International Search Report; International Application No. PCT/US2012/062111; International Filing Date: Oct. 26, 2012; Date of Mailing: Aug. 6, 2013; 4 Pages.

(Continued)

*Primary Examiner* — Wenwen Cai
(74) *Attorney, Agent, or Firm* — Cantor Colburn LLP

(57) ABSTRACT

In an embodiment, a photovoltaic module, comprises a transparent superstrate; a backsheet, wherein the backsheet comprises a core layer comprising a core composition formed from a first polycarbonate comprising dimethyl bisphenol cyclohexane carbonate repeat units and bishpenol-A, wherein the first polycarbonate has the structure

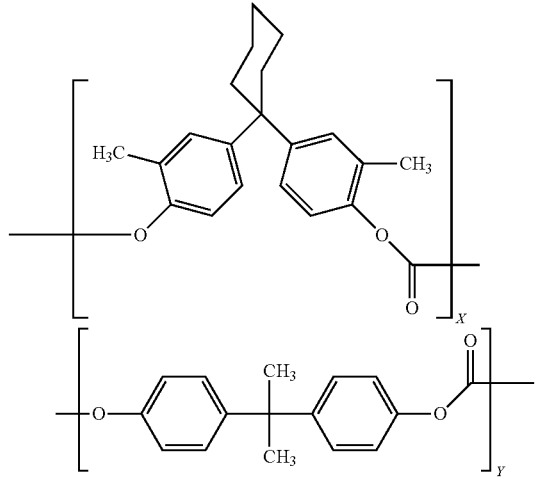

wherein the dimethyl bisphenol cyclohexane carbonate repeat units are present in an amount of 10 wt. % to 50 wt. %, based on the total repeat units in the core composition; and a second polycarbonate selected from the group consisting of a bisphenol-A polycarbonate homopolymer, a polyphthalate carbonate copolymer, a polycarbonate copolymer comprising 2-phenyl-3,3-bis(4-hydroxyphenyl) phthalimidine carbonate and bisphenol-A carbonate repeat units, a polycarbonate copolymer comprising bisphenol-A carbonate and tetrabromobisphenol A carbonate repeat units, and combinations comprising at least one of the foregoing; and a photovoltaic cell between the superstrate and the backsheet.

19 Claims, 1 Drawing Sheet

(56) References Cited

U.S. PATENT DOCUMENTS

| | | |
|---|---|---|
| 7,524,919 B2 | 4/2009 | Hoover et al. |
| 7,547,755 B2 | 6/2009 | Heuer |
| 7,649,073 B2 | 1/2010 | Davis et al. |
| 7,655,737 B2 | 2/2010 | Chakravarti et al. |
| 7,687,583 B2 | 3/2010 | Chakravarti et al. |
| 7,691,950 B2 | 4/2010 | Chakravarti et al. |
| 7,700,696 B2 | 4/2010 | van de Grampel et al. |
| 7,709,581 B2 | 5/2010 | Glasgow et al. |
| 7,718,733 B2 | 5/2010 | Juikar et al. |
| 7,754,402 B2 | 7/2010 | Hamasaki et al. |
| 7,759,456 B2 | 7/2010 | Brack et al. |
| 7,829,632 B2 | 11/2010 | Chakravarti et al. |
| 7,879,967 B2 | 2/2011 | Ebert et al. |
| 2003/0108710 A1 | 6/2003 | Coyle et al. |
| 2004/0013882 A1 | 1/2004 | Gorny et al. |
| 2006/0135690 A1 | 6/2006 | Juikar et al. |
| 2007/0009741 A1 | 1/2007 | Boven et al. |
| 2007/0065615 A1 | 3/2007 | Odle et al. |
| 2007/0066739 A1 | 3/2007 | Odle et al. |
| 2007/0066740 A1 | 3/2007 | Odle et al. |
| 2007/0066741 A1 | 3/2007 | Donovan et al. |
| 2007/0085242 A1 | 4/2007 | Tamaki et al. |
| 2007/0142569 A1 | 6/2007 | Donovan et al. |
| 2007/0149629 A1 | 6/2007 | Donovan et al. |
| 2007/0167544 A1 | 7/2007 | Pal et al. |
| 2007/0173618 A1 | 7/2007 | Shaikh et al. |
| 2007/0191519 A1 | 8/2007 | Jiao et al. |
| 2007/0299241 A1 | 12/2007 | Domingo et al. |
| 2008/0004404 A1 | 1/2008 | van de Grampel et al. |
| 2008/0004426 A1 | 1/2008 | Brack et al. |
| 2008/0015289 A1 | 1/2008 | Siripurapu |
| 2008/0015290 A1 | 1/2008 | Siripurapu et al. |
| 2008/0015291 A1 | 1/2008 | Siripurapu et al. |
| 2008/0015292 A1 | 1/2008 | Lens et al. |
| 2008/0027167 A1 | 1/2008 | Vollenberg et al. |
| 2008/0081884 A1 | 4/2008 | Glasgow et al. |
| 2008/0081893 A1 | 4/2008 | Hoover et al. |
| 2008/0081895 A1 | 4/2008 | Lens et al. |
| 2008/0081896 A1 | 4/2008 | Heuer |
| 2008/0119617 A1 | 5/2008 | Chakravarti et al. |
| 2008/0153020 A1 | 6/2008 | Hamasaki et al. |
| 2008/0161507 A1 | 7/2008 | Chakravarti et al. |
| 2008/0249234 A1 | 10/2008 | Ebert et al. |
| 2008/0254299 A1 | 10/2008 | Blackburn et al. |
| 2008/0269386 A1 | 10/2008 | Chakravarti et al. |
| 2008/0269399 A1 | 10/2008 | Chakravarti et al. |
| 2008/0269400 A1 | 10/2008 | Chakravarti et al. |
| 2008/0312374 A1 | 12/2008 | Davis et al. |
| 2009/0030128 A1 | 1/2009 | Chakravarti et al. |
| 2009/0030129 A1 | 1/2009 | Chakravarti et al. |
| 2009/0030171 A1 | 1/2009 | Leenders et al. |
| 2009/0176946 A1 | 7/2009 | Kusters et al. |
| 2012/0048375 A1 | 3/2012 | Hsu et al. |
| 2013/0167927 A1 | 7/2013 | Ichimura et al. |

FOREIGN PATENT DOCUMENTS

| | | |
|---|---|---|
| EP | 2199076 A1 | 6/2010 |
| JP | S4854158 A | 7/1973 |
| JP | 2007108582 A | 4/2007 |
| WO | 9963002 | 12/1999 |
| WO | 0183615 A2 | 11/2001 |
| WO | 2006073728 A2 | 7/2006 |
| WO | 2007008390 A2 | 1/2007 |
| WO | 2007047218 A1 | 4/2007 |
| WO | 2007075365 A2 | 7/2007 |
| WO | 2007078713 A2 | 7/2007 |
| WO | 2007078737 A1 | 7/2007 |
| WO | 2007078788 A2 | 7/2007 |
| WO | 2007084478 A2 | 7/2007 |
| WO | 2007084538 A2 | 7/2007 |
| WO | 2007136934 A1 | 11/2007 |
| WO | 2008002721 A1 | 1/2008 |
| WO | 2008002734 A2 | 1/2008 |
| WO | 2008008584 A2 | 1/2008 |
| WO | 2008008610 A2 | 1/2008 |
| WO | 2008014273 A1 | 1/2008 |
| WO | 2008042491 A1 | 4/2008 |
| WO | 2008042498 A1 | 4/2008 |
| WO | 2008042500 A1 | 4/2008 |
| WO | 2008048718 A2 | 4/2008 |
| WO | 2008051652 A1 | 5/2008 |
| WO | 2008054884 A2 | 5/2008 |
| WO | 2008060726 A1 | 5/2008 |
| WO | 2008082706 A1 | 7/2008 |
| WO | 2008088336 A1 | 7/2008 |
| WO | 2008091253 A1 | 7/2008 |
| WO | 2008127938 A1 | 10/2008 |
| WO | 2008134229 A1 | 11/2008 |
| WO | 2008134230 A1 | 11/2008 |
| WO | 2008134340 A1 | 11/2008 |
| WO | 2008157328 A1 | 12/2008 |
| WO | 2009015191 A1 | 1/2009 |
| WO | 2009015194 A1 | 1/2009 |

OTHER PUBLICATIONS

Written Opinion of the International Searching Authority; International Application No. PCT/US2012/062111; International Filing Date: Oct. 26, 2012; Date of Mailing: Aug. 6, 2013; 4 Pages.

Japanese U.S. Pat. No. 2007108582 (A); Publication Date: Apr. 26, 2007; Abstract Only; 1 Page.

Chinese Patent No. 102064208; Date of Publication: May 18, 2011; Abstract Only, 1 page.

COMPOSITION, MULTILAYER SHEETS MADE THEREFROM, AND METHODS FOR MAKING AND USING THE SAME

The present disclosure relates to a polycarbonate composition, a polycarbonate sheet, and a photovoltaic module.

BACKGROUND

Photovoltaic (PV) modules generally contain solar cells sealed by an encapsulant which are laminated to a superstrate and a backsheet. The backsheet for PV modules generally consists of a tri-layer laminate structure such as polyvinyl fluoride (PVF; e.g., Tedlar*)-polyethylene terephthalate (PET)-PVF laminate (i.e., TPT laminate). PVF layers provide weathering resistance, while PET provides mechanical strength, dielectric insulation, and water vapor resistance, all desired properties of a PV module backsheet. However, PVF is a fluoropolymer that is not only expensive but is also not friendly to the environment, and difficult to manufacture. PET can typically form low cost plastic films with good mechanical, electrical and water vapor barrier properties, but PET film is susceptible to hydrolysis when exposed to high humidity and hot environments during long term use. Therefore, the performance of the entire backsheet may deteriorate during the lifetime of the PV module. In addition, manufacturing the TPT laminate requires separate adhesive layers to bond the PET and PVF layers together. Such adhesive bonding is typically not of sufficient strength for PV module applications to last the useful life of the module, and the bonding strength can also deteriorate during long-term outdoor exposure of the backsheet, which can lead to interlayer delamination issues.

Besides TPT type structures, the backsheet can have a TPE structure that comprises a fluoropolymer layer (T), a PET layer (P), and a polyethylene layer (E). The TPE backsheet can be utilized to reduce the usage of fluoropolymer in the entire backsheet structure. However, such a backsheet can still require steps to make the individual layers and an additional layer-to-layer lamination process using adhesive layers between the PET layer and the fluoropolymer layer and between the PET layer and the polyethylene layer. As a result, the overall manufacturing cost can be relatively high and the product can also suffer interlayer delamination risk due to insufficient adhesive bonding between the layers during long-term outdoor use.

Polycarbonate based sheets can improve some of the properties that are lacking in a PVF-PET-PVF backsheet. For example, 1,1 bis(4-hydroxy-3-methylphenyl)cyclohexane (dimethyl bisphenol cyclohexane, DMBPC) based polycarbonate copolymer (e.g. Lexan* DMX resins, commercially available from SABIC Innovative Plastics) can provide comparable moisture resistance and better water vapor barrier than bisphenol-A (BPA) based polycarbonate (PC) polymers as shown in U.S. Pat. No. 4,304,899, but articles made from DMBPC polycarbonate copolymers generally suffer from inadequate impact resistance. U.S. Patent Application No. 2009/0176946 discloses a blend of a DMBPC polycarbonate copolymer and BPA polycarbonate to balance pencil hardness and impact resistance. U.S. Patent Application No. 2008/0254299 discloses a composite comprising a DMBPC polycarbonate containing top layer and a BPA polycarbonate based second layer where the formulations therein were optimized for achieving a better pencil hardness of the DMBPC polycarbonate containing top layer. U.S. Pat. No. 7,521,119 discloses DMBPC based polycarbonate copolymers that exhibit better polymer degradation resistance than BPA polycarbonate when both are exposed to ammonia-rich environments such as would be found in rural areas utilizing PV energy systems.

A common environmental condition that many PV modules can be subject to is the combination of ambient heat and high humidity, for which hydrothermal resistance of the PV packaging materials is desired. Thus, there is a need for optimized polycarbonate formulations that can be effectively used in PV module applications.

SUMMARY

Disclosed, in various embodiments, are polycarbonate compositions and polycarbonate sheets, and methods for making and using the same.

In one embodiment, a photovoltaic module comprises: a transparent superstrate; a backsheet, wherein the backsheet comprises a core layer comprising a core composition formed from a first polycarbonate comprising dimethyl bisphenol cyclohexane carbonate repeat units and bisphenol-A repeat units, wherein the first polycarbonate has the structure

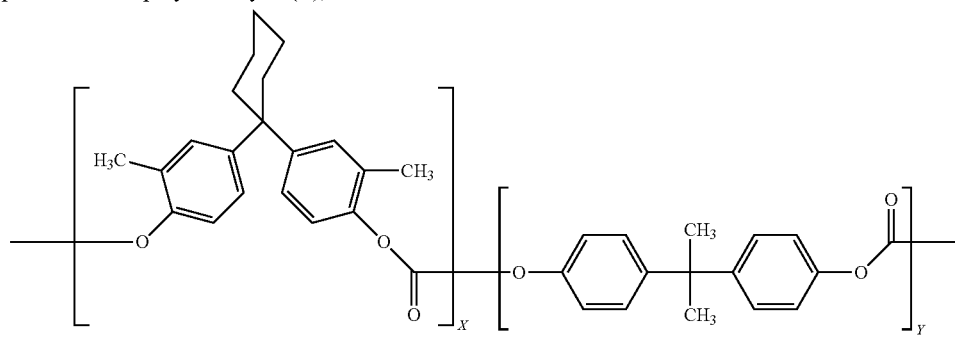

wherein the dimethyl bisphenol cyclohexane carbonate repeat units are present in an amount of 10 wt. % to 50 wt. %, based on the total repeat units in the core composition; and a second polycarbonate selected from the group consisting of a bisphenol-A polycarbonate homopolymer, a polyphthalate carbonate copolymer, a polycarbonate copolymer comprising 2-phenyl-3,3-bis(4-hydroxyphenyl) phthalimidine carbonate and bisphenol-A carbonate repeat units, a polycarbonate copolymer comprising bisphenol-A carbonate and tetrabromobisphenol A carbonate repeat units, and combinations comprising at least one of the foregoing; and a photovoltaic cell between the superstrate and the backsheet.

In another embodiment, a multilayer sheet comprises: a core layer formed from a core composition comprising a first polycarbonate comprising dimethyl bisphenol cyclohexane carbonate repeat units and bisphenol-A repeat units, wherein the first polycarbonate has the structure

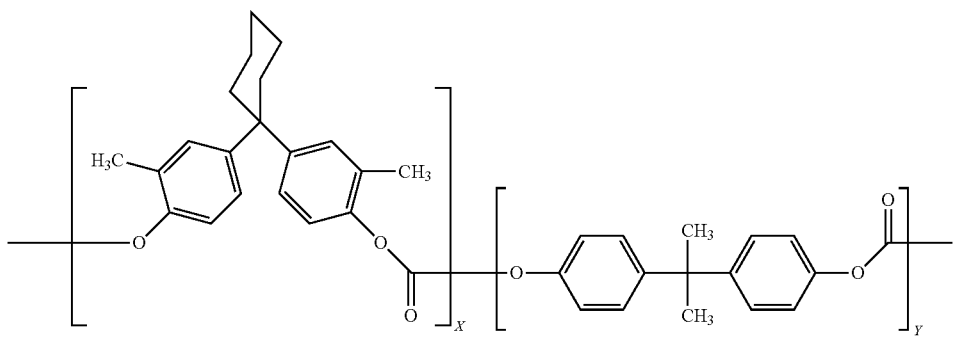

wherein the dimethyl bisphenol cyclohexane carbonate repeat units are present in an amount of 10 wt. % to 50 wt. %, based on the total repeat units in the core compositions; a second polycarbonate comprising a polyphthalate carbonate copolymer having the structure

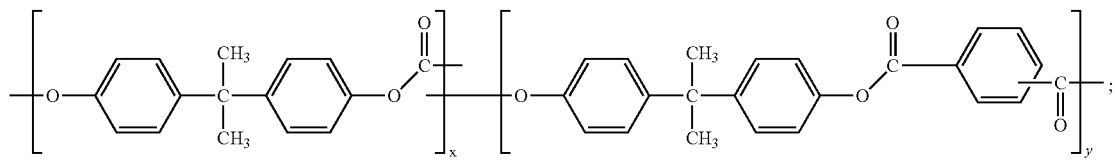

and a third polycarbonate comprising bisphenol-A polycarbonate homopolymer; and a first cap layer disposed on a surface of the core layer.

In an embodiment a composition comprises: a first polycarbonate comprising dimethyl bisphenol cyclohexane carbonate repeat units and bisphenol-A repeat units, wherein the first polycarbonate has the structure

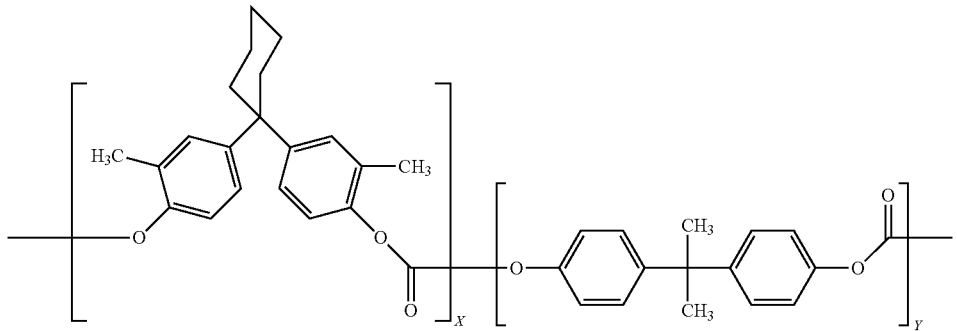

wherein the dimethyl bisphenol cyclohexane carbonate repeat units are present in an amount of 10 wt. % to 50 wt. %, based on the total repeat units in the composition; and a second polycarbonate comprising a polyphthalate carbonate copolymer having the structure

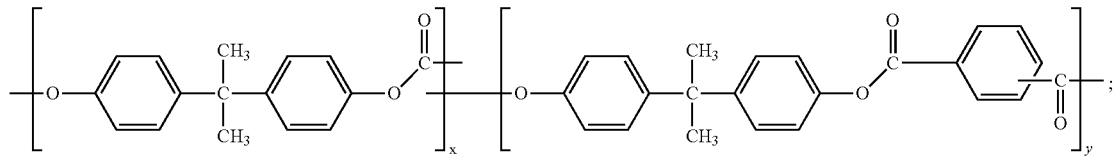

and a third polycarbonate comprising a bisphenol-A polycarbonate homopolymer.

In an embodiment, a method of making a multilayer sheet comprises: co-extruding a core layer and a first cap layer, wherein the core layer comprises a core composition comprising a first polycarbonate composition comprising dimethyl bisphenol cyclohexane carbonate repeat units and bisphenol-A repeat units, wherein the first polycarbonate has the structure

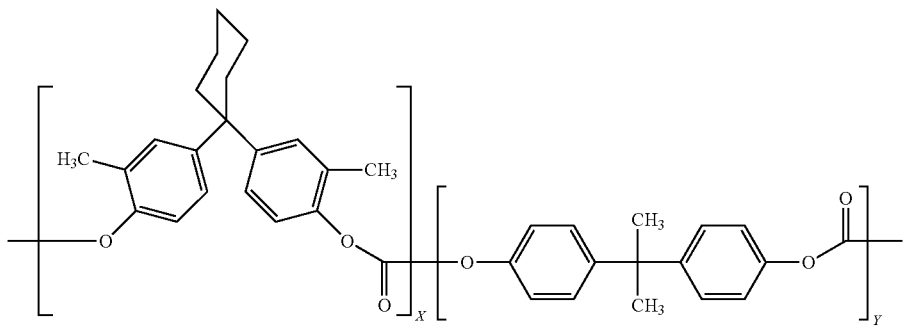

wherein the dimethyl bisphenol cyclohexane carbonate repeat units are present in an amount of 10 wt. % to 50 wt. %, based on the total repeat units in the core composition; a second polycarbonate comprising a polyphthalate carbonate copolymer having the structure

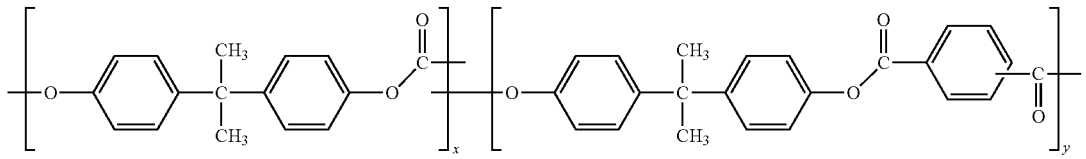

and a third polycarbonate comprising a bisphenol-A polycarbonate homopolymer; and wherein the first cap layer comprises a member selected from the group consisting of polycarbonate and a UV light absorbing stabilizer, a resorcinol polyarylate carbonate copolymer, and combinations comprising at least one of the foregoing.

These and other features and characteristics are more particularly described below.

BRIEF DESCRIPTION OF THE DRAWINGS

The following is a brief description of the drawings wherein like elements are numbered alike and which are presented for the purposes of illustrating the exemplary embodiments disclosed herein and not for the purposes of limiting the same.

DETAILED DESCRIPTION

Disclosed herein, in various embodiments, is a multilayer sheet (film and sheet are used interchangeably herein) comprising a core layer and, a cap layer (e.g., a weathering protection layer that can be joined with the core layer). The multilayer sheets can be used in various electronic applications, including, but not limited to, PV modules and can provide hydrothermally stable sheets with a retention of puncture resistance of greater than or equal to 30% and thermal shrinkage in the machine direction and/or transverse direction of less than or equal to 1%. The core layer can be formed from a core composition comprising a first polycarbonate comprising DMBPC carbonate homopolymer or a copolymer comprising DMBPC carbonate and BPA carbonate (e.g., DMBPC carbonate repeat units and BPA carbonate repeat units), wherein the repeat units of DMBPC carbonate are present in an amount of 10 weight percent (wt. %) to 50 wt. %, based on the total repeat units in the core composition and a second polycarbonate selected from the group consisting of a BPA polycarbonate homopolymer; a polyphthalate carbonate (PPC) copolymer comprising BPA phthalate ester blocks and BPA carbonate blocks; a high heat polycarbonate copolymer comprising 2-phenyl-3,3-bis(4-hydroxyphenyl) phthalimidine (p,p-PPPBP) carbonate and BPA carbonate as repeat units (e.g., Lexan* XHT resins, commercially available from SABIC Innovative Plastics); a polycarbonate copolymer comprising BPA carbonate and tetrabromobisphenol A (TBBPA) carbonate as repeat units, and combinations comprising at least one of the foregoing.

In an embodiment, the core composition can comprise a first polycarbonate comprising DMBPC carbonate repeat units, where the repeat units are present in an amount of 10 wt. % to 50 wt. %, based on the total repeat units in the core composition; a second polycarbonate comprising a PPC copolymer; and a third polycarbonate comprising a BPA polycarbonate homopolymer.

Figure 4:
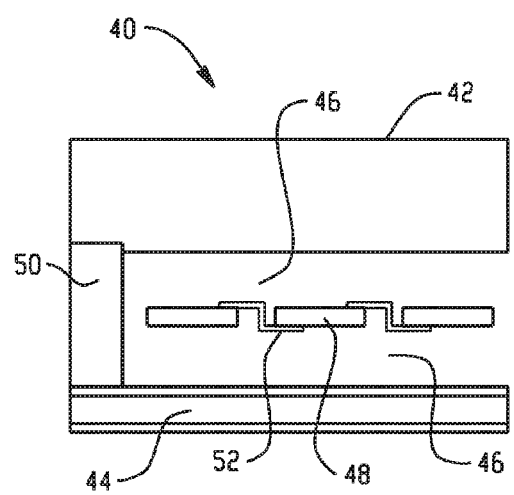
FIG. 4 is a schematic view of a PV module.

In crystalline-silicon PV modules (see e.g., FIG. 4 where a PV module 40 is illustrated), the solar cells 48 are generally held in place with connectors 52 and also are surrounded by a transparent encapsulant 46 and laminated to a transparent superstrate 42 and a backsheet 44 at both sides as illustrated in FIG. 4. The PV module is also surrounded by a sealant 50. In an exemplary PV module assembly process, a superstrate 42, encapsulant 46, solar cells 48, and a backsheet 44 are put in direct contact from layer to layer (as illustrated in FIG. 4) and then laminated under heat and pressure in order to achieve complete encapsulation of the solar cells 48 and sufficient bonding strength between the layers. The superstrate 42 and the backsheet 44 can provide mechanical protection, weathering protection, and electrical insulation to the solar module during long-term outdoor use. It can be desirable for the superstrate 42 to possess good UV weathering protection capabilities since it is exposed to direct sun light. Generally, the backsheet 44 is not subjected to direct sun exposure in most PV module applications, but it can still be desirable for the backsheet 44 to be protected from UV exposure due to indirect light, such as reflected or scattered UV light from the surrounding environment.

In addition, when PV modules are exposed to high temperatures (e.g., greater than or equal to 50° C. and high humidity (e.g., greater than or equal to 50% relative humidity), hydrothermal resistance of the backsheet and superstrate can ensure that the backsheet and the superstrate survive long-term use without degradation under such harsh conditions. For example, IEC61730-2 requires that PV modules pass a minimum of 1,000 hours of a damp heat test at conditions of 85° C. and 85% relative humidity. A water vapor barrier can also be desirable for the superstrate and the backsheet, since it can help reduce the chances of cell corrosion and potential delamination of the superstrate and the backsheet from the encapsulant due to the ingression of moisture from the environment.

Poly (ethylene-co-vinyl acetate) (EVA) resin with vinyl acetate content of 25 wt. % to 35 wt. %, along with an additive package comprising an organic peroxide as a cross-linking agent, light stabilizer, and/or adhesion promoter, can be used as the solar cell encapsulant. A PV module assembly process using EVA as the encapsulant can comprise heating the assembly to 135° C. to 150° C. and applying vacuum and pressure for a few minutes to achieve sufficient curing of the EVA material to encapsulate the solar cells and also bond the superstrate and the backsheet to the assembly. In such cases, low thermal shrinkage of the backsheet and superstrate can be important to avoid disruption of cell-to-cell spacing of the solar cell array due to thermal shrinkage of the backsheet or the superstrate during the PV module assembly process.

The polycarbonate composition and sheets comprising the composition disclosed herein are able to provide good hydrothermal resistance and good puncture resistance, meaning that the sheets can pass the requirements set forth in IEC61730-2 (i.e., pass a minimum of 1,000 hours of a damp heat test at conditions of 85° C. and 85% relative humidity; low thermal shrinkage (e.g., less than or equal to 3%, specifically, less than or equal to 1%), low water vapor transmission rate (WVTR) (e.g., less than or equal to 15 g/m²-24 hour), UV weathering resistance, a low cost manufacturing process if both a core layer and a weatherable cap layer can be produced and bonded together in a single step co-extrusion process; and environmental friendliness if the cap layer (e.g., weathering protection layer) optionally comprises a halogen free polymer. For example, the sheets disclosed herein can provide a retention of puncture resistance after environmental exposure of greater than or equal to 30%, specifically, greater than or equal to 40%, more specifically, greater than or equal to 50%, even more specifically, greater than or equal to 60%, and still more specifically greater than or equal to 70%.

In one embodiment, a multilayer sheet is disclosed, where the multilayer sheet comprises a core layer and a cap layer (e.g., a weatherable cap layer). The core layer can comprise a core composition comprising a first polycarbonate comprising DMBPC carbonate homopolymer or a copolymer comprising DMBPC carbonate and BPA carbonate, wherein the repeat units of DMBPC carbonate are present in an amount of 10 wt. % to 50 wt. % based on the total number of repeat units in the core composition; and a second polycarbonate selected from the group consisting of a BPA polycarbonate homopolymer; a PPC copolymer; a polycarbonate copolymer comprising p,p-PPPBP carbonate and BPA carbonate; and a polycarbonate copolymer comprising BPA carbonate and TBBPA carbonate, and combinations comprising at least one of the foregoing. Such a multilayer sheet is capable of having good hydrothermal resistance, low thermal shrinkage, good impact resistance, low WVTR and UV weathering resistance. The multilayer sheet can be used in a PV module as a backsheet and/or a superstrate (if the multilayer sheet is transparent) wherein the PV module comprises a superstrate, a backsheet, and a solar cell between the superstrate and the backsheet. If the second polycarbonate comprises a PPC copolymer, a polycarbonate copolymer comprising p,p-PPPBP carbonate and BPA carbonate, or a polycarbonate copolymer comprising TBBPA carbonate and BPA carbonate, a third polycarbonate comprising a BPA polycarbonate can also, optionally, be present in the core composition. The inclusion of a third polycarbonate into the core composition can function to increase the compatibility of the first polycarbonate comprising DMBPC carbonate repeat units and the second polycarbonate comprising a PPC copolymer, a p,p-PPPBP carbonate copolymer, or a TBBPA carbonate copolymer and to adjust the melt flow of the core composition (e.g., lower the viscosity of the core composition). The inclusion of PPC into the core composition can help to decrease the thermal shrinkage of the multilayer sheet.

If the second polycarbonate comprises a PPC copolymer, and/or a p,p-PPPBP carbonate copolymer, and/or a TBBPA carbonate copolymer, the second polycarbonate can be present in an amount of 20 wt. % to 50 wt. %, and the third polycarbonate can be present in an amount of 0 wt. % to 40 wt. %, based on a total weight of the composition of 100 wt. %. In another embodiment, the second polycarbonate can be present in an amount of 40 wt. % to 50 wt. %, and the third polycarbonate can be present in an amount of 10 wt. % to 25 wt. %, based on a total weight of the composition of 100 wt. %.

If the second polycarbonate comprises BPA polycarbonate, it can be present in an amount of 20 wt. % to 90 wt. %, specifically, 30 wt. % to 80 wt. %, and more specifically, 45 wt. % to 75 wt. % of the second polycarbonate.

As used herein, the term "polycarbonate" means compositions having repeating structural carbonate units of formula (1)

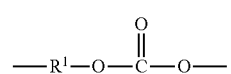
(1)

in which at least 60 percent of the total number of $R^1$ groups contain aromatic moieties and the balance thereof are aliphatic, alicyclic, or aromatic. In an embodiment, each $R^1$ is a $C_{6-30}$ aromatic group, that is, contains at least one aromatic moiety. $R^1$ can be derived from a dihydroxy compound of the formula HO—$R^1$—OH, in particular of formula (2)

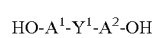
(2)

wherein each of $A^1$ and $A^2$ is a monocyclic divalent aromatic group and $Y^1$ is a single bond or a bridging group having one or more atoms that separate $A^1$ from $A^2$. In an exemplary embodiment, one atom separates $A^1$ from $A^2$. Specifically, each $R^1$ can be derived from a dihydroxy aromatic compound of formula (3)

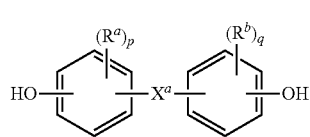

(3)

wherein $R^a$ and $R^b$ each represent a halogen or $C_{1-12}$ alkyl group and can be the same or different; and p and q are each independently integers of 0 to 4. It will be understood that $R^a$ is hydrogen when p is 0, and likewise $R^b$ is hydrogen when q is 0. Also in formula (3), $X^a$ represents a bridging group connecting the two hydroxy-substituted aromatic groups, where the bridging group and the hydroxy substituent of each $C_6$ arylene group are disposed ortho, meta, or para (specifically para) to each other on the $C_6$ arylene group. In an embodiment, the bridging group $X^a$ is single bond, —O—, —S—, —S(O)—, —S(O)$_2$—, —C(O)—, or a $C_{1-18}$ organic group. The $C_{1-18}$ organic bridging group can be cyclic or acyclic, aromatic or non-aromatic, and can further comprise heteroatoms such as halogens, oxygen, nitrogen, sulfur, silicon, or phosphorous. The $C_{1-18}$ organic group can be disposed such that the $C_6$ arylene groups connected thereto are each connected to a common alkylidene carbon or to different carbons of the $C_{1-18}$ organic bridging group. In one embodiment, p and q are each 1, and $R^a$ and $R^b$ are each a $C_{1-3}$ alkyl group, specifically methyl, disposed meta to the hydroxy group on each arylene group.

In an embodiment, $X^a$ is a substituted or unsubstituted $C_{3-18}$ cycloalkylidene, a $C_{1-25}$ alkylidene of formula —C($R^c$)($R^d$)— wherein $R^c$ and $R^d$ are each independently hydrogen, $C_{1-12}$ alkyl, $C_{1-12}$ cycloalkyl, $C_{7-12}$ arylalkyl, $C_{1-12}$ heteroalkyl, or cyclic $C_{7-12}$ heteroarylalkyl, or a group of the formula —C(=$R^e$)— wherein $R^e$ is a divalent $C_{1-12}$ hydrocarbon group. Exemplary groups of this type include methylene, cyclohexylmethylene, ethylidene, neopentylidene, and isopropylidene, as well as 2-[2.2.1]-bicycloheptylidene, cyclohexylidene, cyclopentylidene, cyclododecylidene, and adamantylidene. A specific example wherein $X^a$ is a substituted cycloalkylidene is the cyclohexylidene-bridged, alkyl-substituted bisphenol of formula (4)

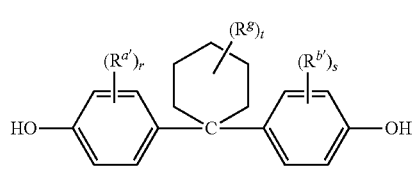

(4)

wherein $R^{a'}$ and $R^{b'}$ are each independently $C_{1-12}$ alkyl, $R^g$ is $C_{1-12}$ alkyl or halogen, r and s are each independently 1 to 4, and t is 0 to 10. In a specific embodiment, at least one of each of $R^{a'}$ and $R^{b'}$ are disposed meta to the cyclohexylidene bridging group. The substituents $R^{a'}$, $R^{b'}$, and $R^g$ can, when comprising an appropriate number of carbon atoms, be straight chain, cyclic, bicyclic, branched, saturated, or unsaturated. In an embodiment, $R^{a'}$ and $R^{b'}$ are each independently $C_{1-4}$ alkyl, $R^g$ is $C_{1-4}$ alkyl, r and s are each 1, and t is 0 to 5. In another specific embodiment, $R^{a'}$, $R^{b'}$ and $R^g$ are each methyl, r and s are each 1, and t is 0 or 3. The cyclohexylidene-bridged bisphenol can be the reaction product of two moles of o-cresol with one mole of cyclohexanone. In another exemplary embodiment, the cyclohexylidene-bridged bisphenol is the reaction product of two moles of a cresol with one mole of a hydrogenated isophorone (e.g., 1,1,3-trimethyl-3-cyclohexane-5-one). Such cyclohexane-containing bisphenols, for example the reaction product of two moles of a phenol with one mole of a hydrogenated isophorone, are useful for making polycarbonate polymers with high glass transition temperatures and high heat distortion temperatures.

In another embodiment, $X^a$ is a $C_{1-18}$ alkylene group, a $C_{3-18}$ cycloalkylene group, a fused $C_{6-18}$ cycloalkylene group, or a group of the formula —$B^1$—W—$B^2$— wherein $B^1$ and $B^2$ are the same or different $C_{1-6}$ alkylene group and W is a $C_{3-12}$ cycloalkylidene group or a $C_{6-16}$ arylene group.

$X^a$ can also be a substituted $C_{3-18}$ cycloalkylidene of formula (5)

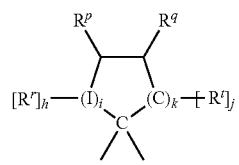

(5)

wherein $R^r$, $R^p$, $R^q$, and $R^t$ are independently hydrogen, halogen, oxygen, or $C_{1-12}$ organic groups; I is a direct bond, a carbon, or a divalent oxygen, sulfur, or —N(Z)— where Z is hydrogen, halogen, hydroxy, $C_{1-12}$ alkyl, $C_{1-12}$ alkoxy, or $C_{1-12}$ acyl; h is 0 to 2, j is 1 or 2, i is an integer of 0 or 1, and k is an integer of 0 to 3, with the proviso that at least two of $R^r$, $R^p$, $R^q$, and $R^t$ taken together are a fused cycloaliphatic, aromatic, or heteroaromatic ring. It will be understood that where the fused ring is aromatic, the ring as shown in formula (5) will have an unsaturated carbon-carbon linkage where the ring is fused. When k is one and i is 0, the ring as shown in formula (5) contains 4 carbon atoms, when k is 2, the ring as shown in formula (5) contains 5 carbon atoms, and when k is 3, the ring contains 6 carbon atoms. In one embodiment, two adjacent groups (e.g., $R^q$ and $R^t$ taken together) form an aromatic group, and in another embodiment, $R^q$ and $R^t$ taken together form one aromatic group and $R^r$ and $R^p$ taken together form a second aromatic group. When $R^q$ and $R^t$ taken together form an aromatic group, $R^p$ can be a double-bonded oxygen atom, i.e., a ketone.

Other useful aromatic dihydroxy compounds of the formula HO—$R^1$—OH include compounds of formula (6)

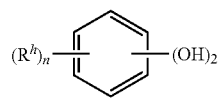

(6)

wherein each $R^h$ is independently a halogen atom, a $C_{1-10}$ hydrocarbyl such as a $C_{1-10}$ alkyl group, a halogen-substituted $C_{1-10}$ alkyl group, a $C_{6-10}$ aryl group, or a halogen-substituted $C_{6-10}$ aryl group, and n is 0 to 4. The halogen is usually bromine.

Some illustrative examples of specific aromatic dihydroxy compounds include the following: 4,4'-dihydroxybiphenyl, 1,6-dihydroxynaphthalene, 2,6-dihydroxynaphthalene, bis(4-hydroxyphenyl)methane, bis(4-hydroxyphenyl) diphenylmethane, bis(4-hydroxyphenyl)-1-naphthylmethane, 1,2-bis(4-hydroxyphenyl)ethane, 1,1-bis(4-hydroxyphenyl)-1-phenylethane, 2-(4-hydroxyphenyl)-2-(3-hydroxyphenyl)propane, bis(4-hydroxyphenyl) phenylmethane, 2,2-bis(4-hydroxy-3-bromophenyl) propane, 1,1-bis(hydroxyphenyl)cyclopentane, 1,1-bis(4-hydroxyphenyl)cyclohexane, 1,1-bis(4-hydroxyphenyl) isobutene, 1,1-bis(4-hydroxyphenyl)cyclododecane, trans-2,3-bis(4-hydroxyphenyl)-2-butene, 2,2-bis(4-hydroxyphenyl)adamantane, alpha, alpha'-bis(4-hydroxyphenyl)toluene, bis(4-hydroxyphenyl)acetonitrile, 2,2-bis(3-methyl-4-hydroxyphenyl)propane, 2,2-bis(3-ethyl-4-hydroxyphenyl)propane, 2,2-bis(3-n-propyl-4-hydroxyphenyl)propane, 2,2-bis(3-isopropyl-4-hydroxyphenyl)propane, 2,2-bis(3-sec-butyl-4-hydroxyphenyl)propane, 2,2-bis(3-t-butyl-4-hydroxyphenyl)propane, 2,2-bis(3-cyclohexyl-4-hydroxyphenyl)propane, 2,2-bis(3-allyl-4-hydroxyphenyl)propane, 2,2-bis(3-methoxy-4-hydroxyphenyl)propane, 2,2-bis(4-hydroxyphenyl)hexafluoropropane, 1,1-dichloro-2,2-bis(4-hydroxyphenyl)ethylene, 1,1-dibromo-2,2-bis(4-hydroxyphenyl)ethylene, 1,1-dichloro-2,2-bis(5-phenoxy-4-hydroxyphenyl)ethylene, 4,4'-dihydroxybenzophenone, 3,3-bis(4-hydroxyphenyl)-2-butanone, 1,6-bis(4-hydroxyphenyl)-1,6-hexanedione, ethylene glycol bis (4-hydroxyphenyl)ether, bis(4-hydroxyphenyl)ether, bis(4-hydroxyphenyl)sulfide, bis(4-hydroxyphenyl)sulfoxide, bis(4-hydroxyphenyl)sulfone, 9,9-bis(4-hydroxyphenyl) fluorine, 2,7-dihydroxypyrene, 6,6'-dihydroxy-3,3,3',3'-tetramethylspiro(bis)indane ("spirobiindane bisphenol"), 3,3-bis(4-hydroxyphenyl)phthalimide, 2,6-dihydroxydibenzo-p-dioxin, 2,6-dihydroxythianthrene, 2,7-dihydroxyphenoxathin, 2,7-dihydroxy-9,10-dimethylphenazine, 3,6-dihydroxydibenzofuran, 3,6-dihydroxydibenzothiophene, and 2,7-dihydroxycarbazole, resorcinol, substituted resorcinol compounds such as 5-methyl resorcinol, 5-ethyl resorcinol, 5-propyl resorcinol, 5-butyl resorcinol, 5-t-butyl resorcinol, 5-phenyl resorcinol, 5-cumyl resorcinol, 2,4,5,6-tetrafluoro resorcinol, 2,4,5,6-tetrabromo resorcinol, or the like; catechol; hydroquinone; substituted hydroquinones such as 2-methyl hydroquinone, 2-ethyl hydroquinone, 2-propyl hydroquinone, 2-butyl hydroquinone, 2-t-butyl hydroquinone, 2-phenyl hydroquinone, 2-cumyl hydroquinone, 2,3,5,6-tetramethyl hydroquinone, 2,3,5,6-tetra-t-butyl hydroquinone, 2,3,5,6-tetrafluoro hydroquinone, 2,3,5,6-tetrabromo hydroquinone, or the like, or combinations comprising at least one of the foregoing dihydroxy compounds.

Specific examples of bisphenol compounds of formula (3) include 1,1-bis(4-hydroxyphenyl)methane, 1,1-bis(4-hydroxyphenyl)ethane, 2,2-bis(4-hydroxyphenyl) propane (hereinafter "bisphenol A" or "BPA"), 2,2-bis(4-hydroxyphenyl) butane, 2,2-bis(4-hydroxyphenyl) octane, 1,1-bis(4-hydroxyphenyl) propane, 1,1-bis(4-hydroxyphenyl) n-butane, 2,2-bis(4-hydroxy-2-methylphenyl) propane, 1,1-bis(4-hydroxy-t-butylphenyl) propane, 3,3-bis(4-hydroxyphenyl) phthalimidine, 2-phenyl-3,3-bis(4-hydroxyphenyl) phthalimidine (p,p-PPPBP), and 1,1-bis(4-hydroxy-3-methylphenyl)cyclohexane (DMBPC). Combinations comprising at least one of the foregoing dihydroxy compounds can also be used. In one specific embodiment, the polycarbonate is a linear homopolymer derived from bisphenol A, in which each of $A^1$ and $A^2$ is p-phenylene and $Y^1$ is isopropylidene in formula (3).

The homopolymer of DMBPC carbonate, which is represented by the x portion of formula (7) or its copolymer with BPA carbonate has an overall chemical structure represented by formula (7)

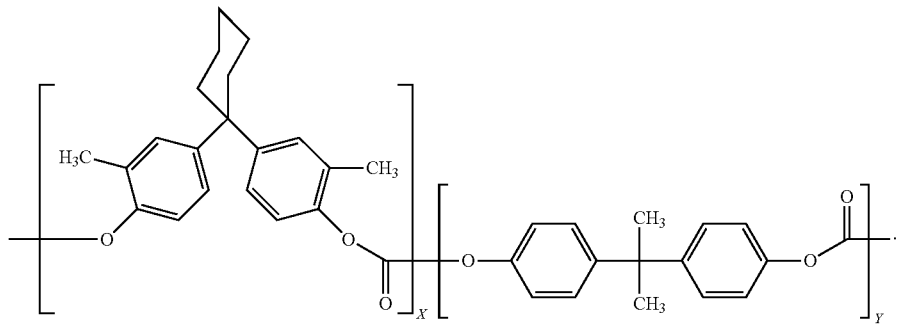

(7)

As previously described, DMBPC carbonate can be co-polymerized with BPA carbonate to form a DMBPC BPA co-polycarbonate. For example, DMBPC based polycarbonate as a copolymer or homopolymer (DMBPC) can comprise 10 to 100 mol % DMBPC carbonate and 90 to 0 mol % BPA carbonate, specifically, 25 mol % DMBPC carbonate and 75 mol % BPA carbonate, more specifically, 50 mol % DMBPC carbonate and 50 mol % BPA carbonate.

The method of making any of the polycarbonates herein described is not particularly limited. It may be produced by any known method of producing polycarbonate including the interfacial process using phosgene and/or the melt process using a diaryl carbonate, such as diphenyl carbonate or bismethyl salicyl carbonate, as the carbonate source.

As mentioned, the second polycarbonate can comprise a PPC polymer comprising a BPA carbonate block and an aromatic ester block (e.g., isophthalate and terephthalate) as shown in formula (8)

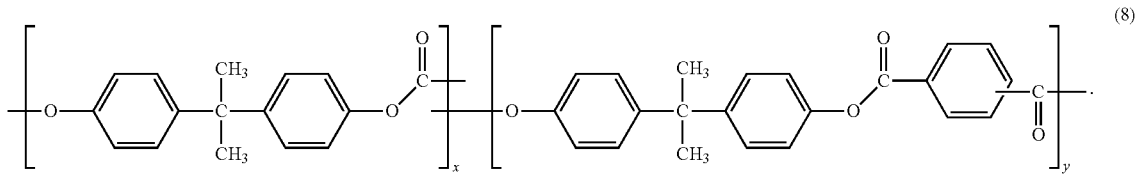

(8)

In an embodiment, the PPC polymer can comprise 10 mol % to 50 mol % BPA carbonate blocks and 50 mol % to 90 mol % aromatic ester blocks, specifically, 20 mol % BPA blocks and 80 mol % aromatic ester blocks, with an isophthalate to terephthalate ratio of 93:7.

A specific example of dihydroxy compounds of formula (2) can be the following formula (9):

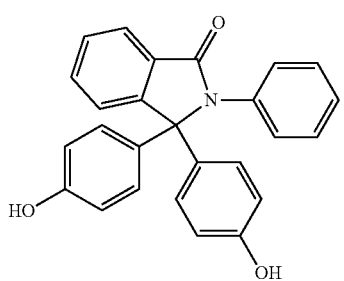

(9)

(also known as 3,3-bis(4-hydroxyphenyl)-2-phenylisoindolin-1-one (PPPBP)) also known as 2-phenyl-3,3-bis(4-hydroxyphenyl)phthalimidine.

The dihydroxy compounds of formula (2) can also be the following formula (10):

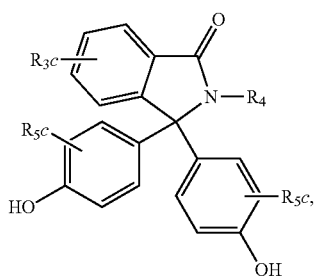

(10)

wherein $R_3$ and $R_5$ are each independently a halogen or a $C_{1-6}$ alkyl group, $R_4$ is a $C_{1-6}$ alkyl, phenyl, or phenyl substituted with up to five halogens or $C_{1-6}$ alkyl groups, and c is 0 to 4. In a specific embodiment, $R_4$ is a $C_{1-6}$ alkyl or phenyl group. In still another embodiment, $R_4$ is a methyl or phenyl group. In another specific embodiment, each c is 0.

In an embodiment, the second polycarbonate can comprise a copolymer of p,p-PPPBP carbonate as described with respect to formulas (9) and (10) and BPA carbonate, where the copolymer has the structure illustrated in formula (11).

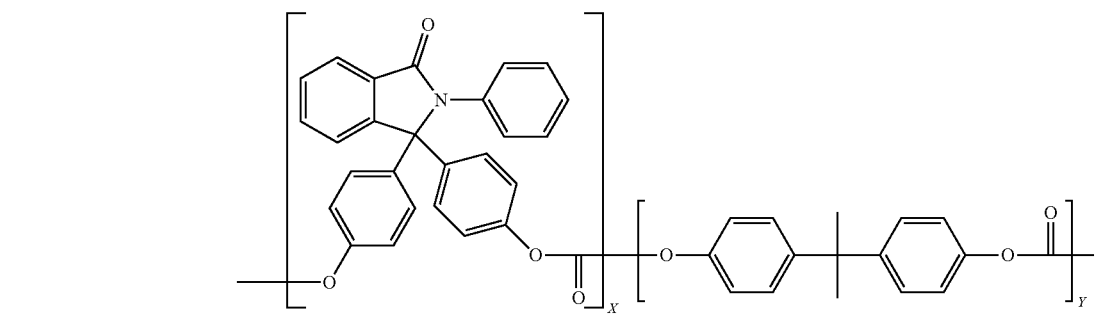

(11)

The copolymer of p,p-PPPBP carbonate and BPA carbonate can comprise 25 mol % to 75 mol % p,p-PPPBP carbonate and 75 mol % to 25 mol % BPA carbonate, specifically, 35 mol % p,p-PPPBP carbonate and 65 mol % BPA carbonate.

In certain embodiments, the second polycarbonate can be a brominated polycarbonate, i.e., a polycarbonate containing brominated carbonate units derived from 2,2',6,6'-tetrabromo-4,4'-isopropylidenediphenol (TBBPA) and carbonate units derived from at least one dihydroxy aromatic compound that is not TBBPA. The dihydroxy aromatic compound can be one of formula (5) and (6).

The relative ratio of TBBPA to the dihydroxy aromatic compound used to manufacture the TBBPA copolymer will depend in some embodiments on the amount of the TBBPA copolymer used and the amount of bromine desired in the polycarbonate composition. In an embodiment, the TBBPA copolymer is manufactured from a composition having 30 to 70 wt % of TBBPA and 30 to 70 wt % of the dihydroxy aromatic compound, specifically bisphenol-A, or specifically 45 to 55 wt % of TBBPA and 45 to 55 wt % of the dihydroxy aromatic compound, specifically bisphenol-A. In an embodiment, no other monomers are present in the TBBPA copolymer.

Combinations of different TBBPA copolymers can be used. Specifically, a TBBPA copolymer can be used having phenol endcaps. Also specifically, a TBBPA carbonate can be used having 2,4,6-tribromophenol endcaps can be used.

The TBBPA copolymers can have an Mw from 18,000 to 30,000 Daltons, specifically 20,000 to 30,000 Daltons as measured by gel permeation chromatography (GPC) using polycarbonate standards. The structure of the copolymer of TBBPA carbonate and BPA carbonate is illustrated by formula (12)

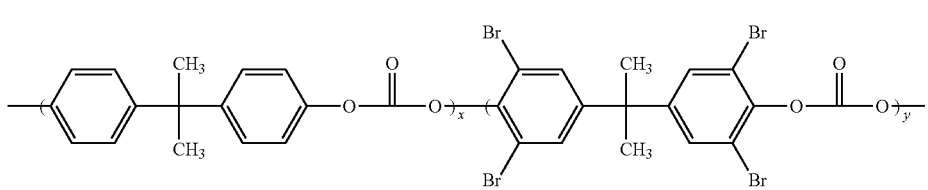

(12)

The copolymer of TBBPA carbonate and BPA carbonate can comprise 25 mol % to 75 mol % TBBPA and 75 mol % to 25 mol % BPA, specifically, 35 mol % TBBPA and 65 mol % BPA.

"Polycarbonates" as used herein further include homopolycarbonates, (wherein each $R^1$ in the polymer is the same), copolymers comprising different $R^1$ moieties in the carbonate (referred to herein as "copolycarbonates"), copolymers comprising carbonate units and other types of polymer units, such as ester units, and combinations comprising at least one of homopolycarbonates and/or copolycarbonates. As used herein, a "combination" is inclusive of blends, mixtures, alloys, reaction products, and the like.

The polycarbonate composition can further include impact modifier(s). Exemplary impact modifiers include natural rubber, fluoroelastomers, ethylene-propylene rubber (EPR), ethylene-butene rubber, ethylene-propylene-diene monomer rubber (EPDM), acrylate rubbers, hydrogenated nitrile rubber (HNBR) silicone elastomers, and elastomer-modified graft copolymers such as styrene-butadiene-styrene (SBS), styrene-butadiene rubber (SBR), styrene-ethylene-butadiene-styrene (SEBS), acrylonitrile-butadiene-styrene (ABS), acrylonitrile-ethylene-propylene-diene-styrene (AES), styrene-isoprene-styrene (SIS), methyl methacrylate-butadiene-styrene (MBS), high rubber graft (HRG), and the like. Impact modifiers are generally present in amounts of 1 to 30 wt. %, based on the total weight of the polymers in the composition.

In addition to the polycarbonate, the composition can include various additives ordinarily incorporated into polymer compositions of this type, with the proviso that the additive(s) are selected so as to not significantly adversely affect the desired properties of the thermoplastic composition, in particular hydrothermal resistance, water vapor transmission resistance, puncture resistance, and thermal shrinkage. Such additives can be mixed at a suitable time during the mixing of the components for forming the composition. Exemplary additives include fillers, reinforcing agents, antioxidants, heat stabilizers, light stabilizers, ultraviolet (UV) light stabilizers, plasticizers, lubricants, mold release agents, antistatic agents, colorants such as such as titanium dioxide, carbon black, and organic dyes, surface effect additives, radiation stabilizers, flame retardants, and anti-drip agents. A combination of additives can be used, for example a combination of a heat stabilizer, mold release agent, and ultraviolet light stabilizer. In general, the additives are used in the amounts generally known to be effective. The total amount of additives (other than any impact modifier, filler, or reinforcing agents) is generally 0.01 to 5 wt. %, based on the total weight of the composition.

Light stabilizers and/or ultraviolet light (UV) absorbing stabilizers can also be used. Exemplary light stabilizer additives include benzotriazoles such as 2-(2-hydroxy-5-methylphenyl)benzotriazole, 2-(2-hydroxy-5-tert-octylphenyl)-benzotriazole and 2-hydroxy-4-n-octoxy benzophenone, or combinations comprising at least one of the foregoing light stabilizers. Light stabilizers are used in amounts of 0.01 to 5 parts by weight, based on 100 parts by weight of the total composition, excluding any filler.

Possible UV absorbing stabilizers include triazines and/or dibenzoylresorcinols. Triazines include:

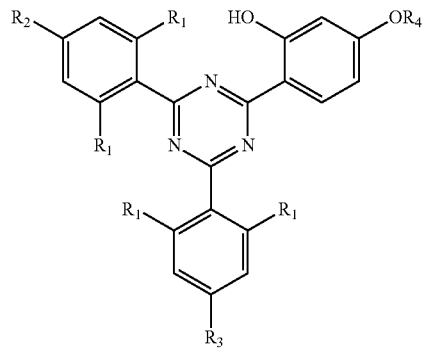

wherein $R_1$=H, $R_2$, $R_3$=independently H, aliphatic $C_1$-$C_{12}$, cycloaliphatic $C_3$-$C_{12}$, or aromatic, $R_4$=H, $C_1$-$C_{24}$ aliphatic, $C_3$-$C_{24}$ cycloaliphatic. Aliphatic and cycloaliphatic groups can also contain alcohol, ether, ester, and carboxylic acid functionality. They can also be linear or branched and may contain silicon. Desirably, $R_1$, $R_2$, and $R_3$=H. Specific examples are $R_1$, $R_2$, $R_3$=H, $R_4$=$C_6H_{13}$ (e.g., Tinuvin® 1577) and $R_1$, $R_2$, $R_3$=H, $R_4$=$CH_2CH_2OOCCH(C_2H_5)CH_2CH_2CH_2CH_3$ (e.g., LA-46).

Possible dibenzoylresorcinols include:

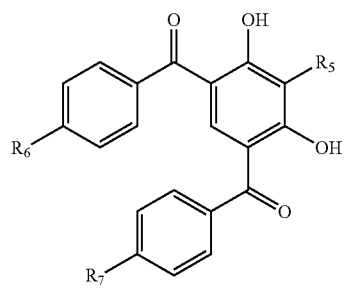

wherein: $R_5$=H, aliphatic $C_1$-$C_{12}$, cycloaliphatic $C_3$-$C_{12}$, $CH_2CH_2CH_2SiR_n(OR_8)_{3-n}$, n=0-2, $R_8$=H, aliphatic $C_1$-$C_{12}$; $R_6$, $R_7$=independently H, aliphatic $C_1$-$C_{12}$, cycloaliphatic $C_3$-$C_{12}$, or aromatic.

Another possible UV absorbing stabilizer is dibenzoylresorcinol:

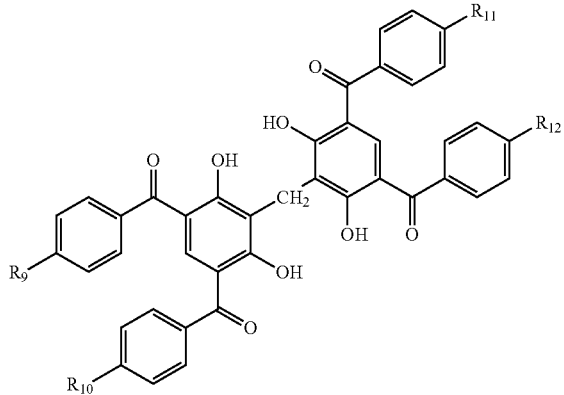

where $R_9$, $R_{19}$, $R_{11}$, $R_{12}$ are independently H, aliphatic $C_1$-$C_{12}$, cycloaliphatic $C_3$-$C_{12}$, or aromatic.

Some specific examples of stable UV absorbing stabilizers are 4,6-dibenzoylresorcinol, silylated 4,6-dibenzoylresorcinols such as described in U.S. Pat. Nos. 5,391,795 and 5,679,820, and 2,4-diphenyl-6-(2'-hydroxy-4'alkoxyphenyl)-1,3,5-triazines (such as Tinuvin* 1577 commercially available from BASF and ADK STAB LA-46 commercially available from Asahi Denka). A stable UV absorbing stabilizer is characterized by a loss rate of less than 0.15 absorbance units at 330 nm per year of extreme weathering as estimated by exposure to 3 MJ/m² (measured at 340 nm) of filtered xenon arc accelerated weathering. Mixtures of UV absorbing stabilizers can be used to improve compatibility.

The UV absorbing stabilizer has a loss rate less than 0.15 absorbance units per year resulting in an estimated erosion rate of less than 4 micrometers per year as measured by xenon arc accelerated weathering. Exemplary UV absorbers are 2,4-diphenyl-6-(2'-hydroxy-4'alkoxyphenyl)-1,3,5-triazines (such as Tinuvin* 1577 commercially available from BASF Corporation, Florham Park, N.J. 07932 and ADK STAB LA-46 commercially available from Adeka Corporation, Tokyo, Japan), resorcinols (such as 4,6-dibenzoylresorcinols and/or coupled 4,6-dibenzoylresorcinols as described in U.S. Pat. No. 5,763,674), as well as combinations comprising at least one of the foregoing Other exemplary UV light absorbing stabilizers include hydroxybenzophenones; hydroxybenzotriazoles; hydroxyphenyl triazines (e.g., 2-hydroxyphenyl triazine); hydroxybenzotriazines; cyanoacrylates; oxanilides; benzoxazinones; 2-(2H-benzotriazol-2-yl)-4-(1,1,3,3-tetramethylbutyl)-phenol (CYASORB* 5411); 2-hydroxy-4-n-octyloxybenzophenone (CYASORB* 531); 2-[4,6-bis(2,4-dimethylphenyl)-1, 3,5-triazin-2-yl]-5-(octyloxy)-phenol (CYASORB* 1164); 2,2'-(1,4-phenylene)bis(4H-3,1-benzoxazin-4-one) (CYASORB* UV-3638); 1,3-bis[2-cyano-3,3-diphenylacryloyl)oxy]-2,2-bis[[(2-cyano-3,3-diphenylacryloyl)oxy]methyl] propane (UVINUL* 3030); 2,2'-(1,4-phenylene) bis(4H-3,1-benzoxazin-4-one); 1,3-bis[2-cyano-3,3-diphenylacryloyl)oxy]-2,2-bis[[(2-cyano-3,3-diphenylacryloyl)oxy]methyl]propane; nano-size inorganic materials such as titanium oxide, cerium oxide, and zinc oxide, all with particle size less than or equal to 100 nanometers, or combinations comprising at least one of the foregoing UV light absorbing stabilizers. UV light absorbing stabilizers are used in amounts of 0.01 to 5 parts by weight, based on 100 parts by weight of the total composition, excluding any filler.

A more complete understanding of the components, processes, and apparatuses disclosed herein can be obtained by reference to the accompanying drawings. These figures (also referred to herein as "FIG.") are merely schematic representations based on convenience and the ease of demonstrating the present disclosure, and are, therefore, not intended to indicate relative size and dimensions of the devices or components thereof and/or to define or limit the scope of the exemplary embodiments. Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

Figure 1:
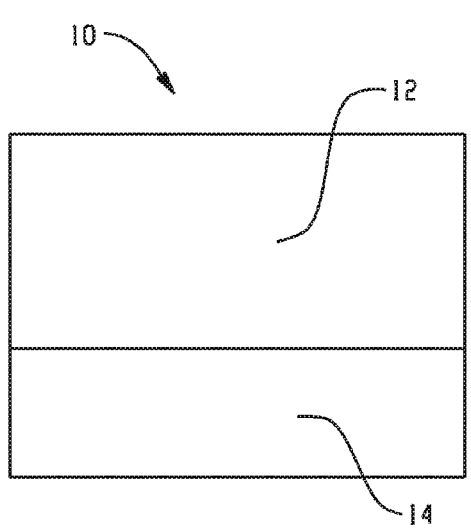
FIG. 1 is a view of an embodiment of a multilayer sheet as described herein.

Generally, the side of a multilayer sheet that is closest to the solar cells in the PV module is referred to as the cell side and the opposite side of the sheet is referred to as the air side. For example, in FIG. 1, a core layer 12 is closest to the solar cells, while in FIGS. 2 and 3, a second cap layer 22 is closest to the solar cells and first cap layer 14 in FIGS. 1 to 3 can generally be described as the air side of the multilayer sheet. FIG. 1 illustrates a multilayer sheet 10 comprising a core layer 12 and a first cap layer 14. The core layer 12 at the cell side of the multilayer sheet 10 can be formed from a core composition comprising a first polycarbonate comprising DMBPC carbonate repeat unit as shown in the formula (7) where the DMBPC carbonate repeat units are present in an amount of 10 wt. % to 50 wt. %, based on the total number of repeat units in the core composition, specifically, 25 wt. % to 50 wt. %, more specifically, 35 wt. % to 40 wt. %, and even more specifically, 40 wt. %; and a second polycarbonate that is selected from the group consisting of a BPA polycarbonate homopolymer, a PPC copolymer, a polycarbonate copolymer comprising repeat units of p,p-PPPBP carbonate and BPA carbonate, a polycarbonate copolymer comprising BPA carbonate and TBBPA carbonate, and combinations comprising at least one of the foregoing. As previously described, if the second polycarbonate comprises a PPC copolymer, then, optionally, a third polycarbonate comprising a BPA carbonate homopolymer can also be present.

The first cap layer 14 can function as a weathering protection layer. In various embodiments, the first cap layer 14 can comprise a weatherable polycarbonate, an acrylic-based resin or coating, or a fluoropolymer based resin or coating, as well as combinations comprising at least one of the foregoing. The weatherable polycarbonate composition can include, but is not limited to, a BPA polycarbonate and a UV light absorbing stabilizer as previously described, a resorcinol polyarylate and carbonate copolymer, and combinations comprising at least one of the foregoing. If the first cap layer 14 comprises a weatherable polycarbonate composition, the multilayer sheet 10 illustrated in FIG. 1 can be produced using a co-extrusion process. If the first cap layer 14 comprises a fluoropolymer resin, an optional adhesive layer can be employed between the core layer 12 and the first cap layer 14 to help bond the layers together. The fluoropolymer resin can be selected from the group consisting of polyvinylfluoride (PVF), polyvinylidene fluoride (PVDF), polytetrafluoroethylene (PTFE), ethylene-tetrafluoroethylene copolymer (ETFE), polychlorotrifluoroethylene (PCTFE or CTFE), ethylene-chlorotrifluoroethylene copolymer (ECTFE), tetrafluoroethylene hexafluoropropylene vinylidenefluoride (THV), and combinations comprising at least one of the foregoing.

During the assembly of a PV module, the core layer 12 of the multilayer sheet 10 as illustrated in FIG. 1 can be directly adhered to an EVA encapsulant, providing good adhesion to the EVA (e.g., greater than or equal to 4 Newtons per millimeter (N/mm) adhesion strength).

Figure 2:
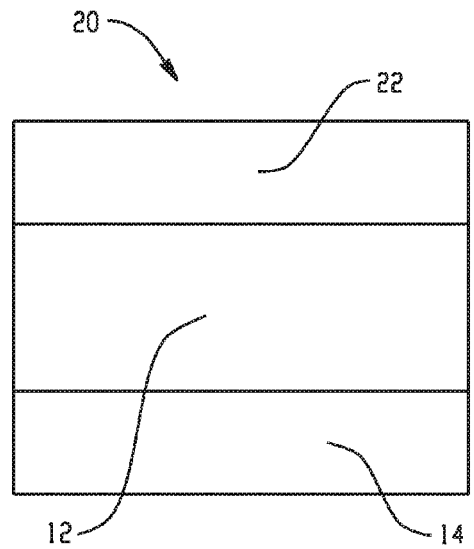
FIG. 2 is a view of an embodiment of a multilayer sheet as described herein.
Figure 3:
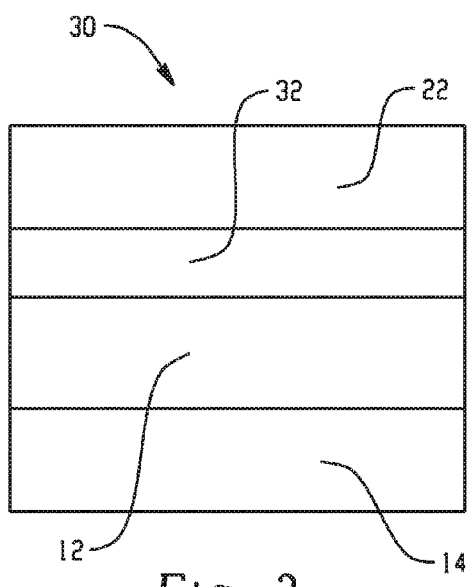
FIG. 3 is a view of an embodiment of a multilayer sheet as described herein.

FIG. 2 and FIG. 3 illustrate similar embodiments to the multilayer sheet 10 of FIG. 1, with the addition of optional layers 22 and/or 32 to the multilayer sheets 20 and 30, respectively. The core layer 12 and first cap layer 14 are as previously described. A second cap layer 22, if present, is disposed on the cell side of the multilayer sheet 10. An adhesive layer 32 can be, optionally, employed to facilitate bonding between the core layer 12 and the second cap layer 22 as illustrated by FIG. 3. In various embodiments, the second cap layer 22 can comprise a polycarbonate composition, a polyolefin resin, a fluoropolymer resin or a fluoropolymer coating comprising a fluoropolymer resin, as well as combinations comprising at least one of the foregoing. The polycarbonate composition can include, but is not limited to, a BPA carbonate. The polyolefin resin utilized for the second cap layer 22 can include, but is not limited to, EVA copolymer with vinyl acetate content from 2 wt % to 10 wt %, low density polyethylene (LDPE), high density polyethylene (HDPE), polypropylene, cyclic olefin copolymer (COC), as well as combinations comprising at least one of the foregoing.

If the second cap layer 22 comprises a polycarbonate composition, a co-extrusion process can be used to make both the second layer 22 and the core layer 12 in one step without the use of an adhesive layer (see e.g., FIG. 2). If the second cap layer 22 comprises a polyolefin, an adhesive layer 32 can be employed between the second cap layer 22 and the core layer 12 to facilitate a bond between the layers (see e.g., FIG. 3). When the second cap layer 22 comprises a polyolefin, it can also provide additional water vapor barrier properties to the multilayer sheet 30 when used in PV module assemblies.

In any of the above described embodiments, the first cap layer 14 and the second cap layer 22, if both present, are the outermost layers of the multilayer sheet 20, 30. When the second cap layer 22 is not present, the first cap layer 14 and the core layer 12 can be the outermost layers of the multilayer sheet 10.

In any of the above described embodiments, both the side of the multilayer sheet facing the cells and the opposite side of the multilayer sheet facing air can, optionally, have a non-flat surface. It can be advantageous to have a matte finish on the cell side surface of the multilayer sheet to aid the elimination of air entrapment during the module lamination process and hence promote adhesion of the multilayer sheet to the encapsulant (e.g., EVA). It can also be advantageous to have an engineered surface texture on the air side of the multilayer sheet. For example, if the multilayer sheet disclosed herein is used as a transparent superstrate for a PV module, the engineered surface texture can enhance the transmission of solar light through the superstrate into the PV module. The enhanced transmission can translate to enhanced power output of the PV module thereby improving the efficiency of the PV module. Engineered surface textures that can achieve this function include, but are not limited to, surface textures comprising a plurality of lenses, microlenses, linear prisms, prisms, pyramids, lenticular structures, as well as combinations comprising at least one of the foregoing. A multilayer sheet with engineered surface texture can be made via several methods such as those described in U.S. Pat. No. 4,280,978, U.S. Pat. No. 7,092,163, and U.S. Patent Publication No. 2003/0108710. These methods include a hot-embossing or stamping process, a melt calendaring extrusion process, an injection molding process, or a micro-replication coating process using radiation-curable coating material. The particular method of making a surface textured plastic sheet is not limited, and is a matter of choice based on economics, availability, and additional application requirements.

The following examples are merely illustrative of the compositions and sheets disclosed herein and are not intended to limit the scope hereof.

EXAMPLES

Sheets comprising the compositions described herein were prepared and tested for various properties. Water vapor barrier is characterized by the water vapor transmission rate (WVTR) and was measured according to ASTM F1249. All WVTR data reported was measured at a temperature of 38° C. and at a relative humidity of 100% and measured in grams per square meter per 24 hours ($g/m^2$-24 hr). Thermal shrinkage was measured according to ASTM D1204 with a thermal treatment of the sheet at 150° C. for 30 minutes. Tensile properties were measured according to ASTM D882, where tensile strength at break is measured in megaPascals (MPa); multi-axial impact (MAI) properties were measured in term of the total energy to break according to ASTM D3763 and reported in Joules (J); and peel strength of the multilayer sheet to the encapsulant sheet (e.g., EVA) were measured by the T-peel method according to ISO 11339. A UV weathering test was performed using an Atlas Xenon arc (Xe-arc) Ci4000 weather-o-meter. In this test, the Xe-arc lamp comprising a Xe-arc burner, a quartz inner filter with a coated infrared absorbing layer (CIRA) and a soda lime glass outer filter was constantly on, and the irradiance level at the sample surface was 0.75 Watts per square meter ($W/m^2$) at 340 nm. The chamber conditions of the weather-o-meter were set to 35° C. air temperature and 55° C. black panel temperature when the water spray is off. Each test sample was also subjected to 30 water sprays per week, where the water sprays were uniformly distributed throughout each week and each spray lasted for 18 minutes. When the water spray is on, the chamber conditions were set at 30° C. for both air temperature and black panel temperature. The Xe-arc test of each sample lasted for at least 2,000 hours. Color of the opaque samples was measured using reflection mode on an Xrite Color-Eye 7000A colorimeter and the color of transparent samples was measured using the transmission mode of the same instrument. The light source was D65 and a 10° observer angle was used for both reflection and transmission modes.

Example 1

Table 1 demonstrates compositions for the second cap layer 22 in FIG. 2 or FIG. 3 (e.g., the film layer directly adhered to an EVA encapsulant) and their peel strength values to an EVA encapsulant sheet. The first film comprised a BPA based polycarbonate homopolymer and showed a peel strength value of 4.5 N/mm. The second film comprised a polymer blend made of 40 wt % of DMBPC carbonate homopolymer and 60 wt % of BPA carbonate homopolymer and showed a peel strength of 4.0 N/mm. Finally, a film comprising EVA copolymer with a vinyl acetate (VA) content of 6.5 wt. % showed a peel strength of 4.0 N/mm.

TABLE 1

| Film Layer directly adhered to EVA encapsulant | Peel strength from EVA encapsulant sheet (N/mm) |
|---|---|
| A film comprising a BPA based polycarbonate homopolymer | 4.5 |
| A film comprising a blend made of 40 wt % of DMBPC based polycarbonate homopolymer and 60 wt % of BPA polycarbonate homopolymer | 4.0 |
| A EVA copolymer film layer with VA content of 6.5 wt. % | 4.0 |

Table 1 demonstrates that a film layer made from a blend of DMBPC carbonate and BPA carbonate has as good peel strength to an EVA encapsulant as a BPA carbonate film layer or a film layer based on EVA with a vinyl acetate contact of 6.5%.

Example 2

In this example, several different material combinations were used to make a single layer sheet to determine an optimum composition for the core layer material. A film extrusion process with a calendaring nip roller set up was used. Samples 1 to 5 and Comparative Samples 1 to 4 (C1 to C4) were tested for initial tensile strength and elongation at break, multi-axial impact (MAI), WVTR, and thermal shrinkage properties. The sheets for Samples 1 to 3 and C1 to C3 were 0.18 mm thick, while Samples 4 and 5 were 0.25 mm thick, and C4 was 0.125 mm thick. Table 2 lists the materials used to make the sheets tested in this example. Weight-average molecular weight (Mw) was determined by a gel permeation chromatography (GPC) method using standard polycarbonate samples having a known molecular weight. Homopolymer of DMBPC carbonate refers to DMBPC carbonate repeat units as shown in the formula (7) being present in 100 mol %. Table 3 displays the sheet compositions for C1 to C4 and Samples 1 to 5 along with the physical properties tested and results before and after hydrothermal treatment, while Table 4 contains more results from the physical tests. In order to evaluate the hydrothermal resistance of these layers, a pressure cooker test (PCT) with the conditions of a temperature of 121° C., saturated water steam pressure of 1.2 bars, and 100% relative humidity for 72 hours was used to treat the films as an accelerated hydrothermal aging process. The sheets after PCT treatment were tested in the same manner for MAI and WVTR properties as shown in Tables 3 and 4. The comparative samples also include tests with two different grades of polyethylene terephthalate (PET). Sample sizes for the Retention of Puncture Resistance and WTVR tests were 4 inches by 4 inches (102 mm by 102 mm).

TABLE 2

| | Material Descriptions |
|---|---|
| DMBPC100 | Homopolymer of DMBPC carbonate with a weight-average Mw of 25,000 |
| BPA-PC1 | Homopolymer of BPA carbonate with a weight-average Mw of 30,000 |
| BPA-PC2 | Homopolymer of BPA carbonate with a weight-average Mw of 21,000 |
| PPC | Copolymer comprising 20 mol % BPA carbonate blocks and 80 mol % BPA terephthalate and isophthalate blocks with an isophthalate to terephthalate ratio of 93:7; Weight-average Mw is 28,500. |
| High-heat PC1 | Polycarbonate copolymer comprising 35 mol % p,p-PPPBP carbonate units and 65 mol % BPA carbonate units with a weight-average Mw of 23,000 |
| Tinuvin 1577 | 2-hydroxyphenyl triazine type UV absorber supplied by BASF, (2,4-diphenyl-6-(2-hydroxy-4-n-hexyloxyphenyl)-1,3,5-triazine) |

TABLE 3

| Sample # | Core Layer Formulation | Thickness (mm) | Initial tensile properties | | Tensile properties after PCT | |
|---|---|---|---|---|---|---|
| | | | Tensile strength at break (MPa) | Elongation at break (%) | Tensile strength at break (MPa) | Elongation at break (%) |
| C1 | Single layer made of BPAPC1 | 0.18 | 51 | 102 | 62 | 4 |
| 1 | Single layer with 25 wt % DMBPC100 and 75 wt % BPA-PC1 | 0.18 | 60 | 66 | 68 | 4 |
| 2 | Single layer with 35 wt % DMBPC100 and 65 wt % BPA-PC1 | 0.18 | 62 | 21 | 64 | 4 |
| 3 | Single layer with 50 wt % DMBPC100 and 50 wt % BPA-PC1 | 0.18 | 67 | 21 | 68 | 4 |
| C2 | Single layer with 70 wt % DMBPC100 and 30 wt % BPA-PC1 | 0.18 | 72 | 6 | 54 | 3 |
| 4 | Single layer with 40 wt % DMBPC100 and 60 wt % BPA-PC1 | 0.25 | 61 | 21 | 69 | 6 |
| 5 | Single layer with 40 wt % DMBPC100, 40 wt % PPC and 20 wt % BPA-PC2 | 0.25 | 69 | 10 | 78 | 7 |
| C3 | Standard grade PET film | 0.18 | 117 | 62 | 0 (sample cracked) | 0 (sample cracked) |
| C4 | PET film with improved hydrolysis resistance | 0.125 | 196 | 55 | 151 | 33 |

TABLE 4

| Sample # | MAI-Total Energy (J) Initial | MAI-Total Energy (J) After PCT | Retention of puncture resistance (%) | Thermal shrinkage (%) MD** | Thermal shrinkage (%) TD*** | WVTR (g/m²-24 hour) Initial | WVTR (g/m²-24 hour) After PCT |
|---|---|---|---|---|---|---|---|
| C1 | 5.9 | 1.4 | 23% | 1.7 | 1.2 | 30.2 | Not tested |
| 1 | 4.6 | 2.3 | 50% | 2.0 | 1.5 | 14.2 | Not tested |
| 2 | 4.6 | 1.9 | 41% | 2.0 | 1.5 | 11.0 | Not tested |
| 3 | 3.9 | 1.7 | 42% | 2.5 | 1.7 | 8.2 | Not tested |
| C2 | 0.4 | 0.0 | 0% | 2.3 | 1.6 | 5.1 | Not tested |
| 4 | 4.2 | 2.5 | 60% | 2.4 | 1.2 | 6.9 | 6.9 |
| 5 | 4.6 | 3 | 65% | 0.6 | 0.5 | 5.7 | 5.7 |
| C3 | 3.9 | 0.0 | 0% | 0.9 | 0.2 | 3.2 | sample cracked |
| C4 | 6.0 | 1.7 | 28% | 1.7 | 1.6 | 4.8 | 5.6 |

**= Machine Direction
***= Transverse Direction

As shown in Tables 3 and 4, the presence of DMBPC carbonate repeat units in an amount of 10 wt. % to 50 wt. %, specifically, 25 wt. % to 50 wt., more specifically, 35 wt. % to 40 wt. %, and even more specifically, 40 wt. % among the total weight of the core layer, gives a good balance of properties for tensile strength at break, elongation at break, MAI, retention of puncture resistance, thermal shrinkage, and WVTR. Comparative Sample 2 demonstrates that too much DMBPC carbonate (e.g., 70 wt %) in the composition can have an adverse effect on the properties where the tensile strength at break and elongation a break both decreased and the MAI was 0 after PCT and the puncture resistance retention was 0%. Tables 3 and 4 further demonstrate that PET based sheets, although they can provide high tensile strength at break values before and after PCT (Comparative Sample 4), have poor retention of puncture resistance. Comparative Sample 3 had a value of 0 for tensile strength at break and elongation at break after PCT. The sheets disclosed herein can have a retention of puncture resistance of greater than or equal to 30%, specifically, greater than or equal to 40%, more specifically, greater than or equal to 50%, and even more specifically, greater than or equal to 60%.

Example 3

In this example, multilayer sheets having several different formulations were made with a core layer and a weatherable protective cap layer using a co-extrusion process with a multi-manifold die and calendaring nip roller set up. The formulations and thicknesses of the core layer and weathering protective layer of each multilayer sample are listed in Table 5. The multilayer sheets were tested for initial tensile properties, MAI, WVTR, thermal shrinkage, and optical properties (color and transmission). The sheets were additionally tested for MAI and WVTR properties after the PCT treatment. The results are summarized in Table 6 where TS refers to tensile strength and TE refers to tensile elongation. The multilayer sheets, after 2,000 hours of UV exposure on the weathering protective cap layer side, were also tested for color variation and light transmission (if the sample was transparent). The results are summarized in Table 7.

Sample 6 was an opaque two layer sheet that was 0.35 mm thick made via the above described co-extrusion process. The sheet comprised a 0.25 mm thick core layer comprising a blend of 40 wt. % DMBPC100 and 60 wt. % BPA-PC1 as the resin matrix and 9.9 parts per hundred (pph) with respect to the weight of the resin matrix and a 0.10 mm thick cap layer comprising BPA-PC1 as the resin matrix with 10.5 pph $TiO_2$ pigment and 5.8 pph Tinuvin 1577 as UV light absorbing stabilizers.

Sample 7 was an opaque two layer sheet that was 0.26 mm thick made via the above described co-extrusion process. The sheet comprised a 0.185 mm thick core layer comprising a blend of 40 wt. % DMBPC100, 40 wt. % PPC, and 20 wt. % BPA-PC2 as the resin matrix and 9.9 pph TiO2 pigment with respect to the weight of the blend and a 0.075 mm thick cap layer having the same formulation as Sample 6.

Sample 8 comprised the same structure and formulation as Sample 7, except that the resin matrix comprised a blend of 40 wt. % DMBPC100, 40 wt. % PPC, 10 wt. % high-heat PC1, and 10 wt. % BPA-PC2.

Sample 9 comprised the same structure and formulation as Sample 6, except that Sample 9 was transparent, instead of being opaque. The formulations of the cap layer and the core layer were the same as Sample 6, except that no $TiO_2$ pigment was used. Such a formulation can be used in applications where transparency is desired, for example, in PV superstrate applications.

TABLE 5

| Sample # | Core layer formulation | Cap layer formulation | Total thickness (mm) | Thickness ratio of core and cap layers |
|---|---|---|---|---|
| 6 | blend of 40 wt % DMBPC100 and 60 wt % BPA-PC1 as resin matrix, and 9.9 phr $TiO_2$ with respect to the weight of the resin matrix | BPA-PC1 as resin matrix and 10.5 phr of $TiO_2$ and 5.8 phr of Tinuvin1577 with respect to the weight of the resin matrix | 0.35 | 71/29 |
| 7 | blend of 40 wt % DMBPC100, 40 wt % PPC and 20 wt % BPA-PC2 as resin matrix, and 9.9 phr $TiO_2$ pigment | same as Example 6 | 0.26 | 71/29 |
| 8 | blend of 40 wt % DMBPC100, 40 wt % PPC, 10 wt % high-heat PC1 and 10% BPA-PC2 as resin matrix, and 9.9 phr $TiO_2$ pigment | same as Example 6 | 0.26 | 71/29 |
| 9 | same as 6 except no $TiO_2$ is added | same as 6 except no $TiO_2$ is added | 0.35 | 71/29 |

TABLE 6

| Sample # | Initial tensile properties TS at break (MPa) | Initial tensile properties TE at break (%) | MAI-Total Energy (J) Initial | MAI-Total Energy (J) After PCT | Retention of puncture resistance (%) | Thermal shrinkage (%) MD | Thermal shrinkage (%) TD | WVTR (gr/sqm-24 hour) Initial | WVTR (gr/sqm-24 hour) After PCT |
|---|---|---|---|---|---|---|---|---|---|
| 6 | 57.0 | 18.4 | 6.9 | 4.2 | 61% | 3.1 | 1.2 | Not tested | Not tested |
| 7 | 57.6 | 27.3 | 4.3 | 3.2 | 74% | 0.8 | 0.4 | 6.5 | 6.5 |
| 8 | 57.5 | 14.3 | 4.6 | Not tested | Not tested | 0.7 | 0.4 | 6.9 | 6.9 |
| 9 | 64.7 | 28.6 | 7.9 | 2.8 | 35% | 4.2 | 1.0 | Not tested | Not tested |

Samples 7 and 8 demonstrate that the addition of PPC to the core layer improved the WVTR properties of the sheet, which is illustrated by the WVTR values for Samples 7 and 8, which remained the same after PCT. Sample 7 also demonstrates the greatest retention of puncture resistance (i.e., retention of MAI-total energy) of 74%. For example, the Samples demonstrate that the sheets disclosed herein can have a retention of puncture resistance of greater than or equal to 70% and a thermal shrinkage in the machine direction and/or transverse direction of less than or equal to 1%.

As described above, Samples 6 and 9 were also tested for UV weathering properties as illustrated in Table 7. In Table 7, Comparative Example 5 (C5) was a 0.35 mm thick BPA polycarbonate transparent film without a UV light stabilizing absorber.

TABLE 7

| Sample # | Delta E of the film after 2,000 hours UV exposure | Light Transmission (%) Before UV exposure | Light Transmission (%) After 2,000 hours UV exposure |
|---|---|---|---|
| 6 (opaque) | 8.2 (measured at cap layer side) | — | — |
| 9 (transparent) | 3.8 | 89 | 89 |
| C5 (transparent) | 13 | 89 | 79 |

Sample 9 demonstrates that the sheet is able to remain transparent after 2,000 hours of UV exposure, while C5, which contained no UV light stabilizing absorbers, had a decrease in the percent light transmission.

Transparent as described herein generally refers to a light transmission of greater than or equal to 80%, while opaque refers to a light transmission of less than or equal 30%. Light transmission is measured according to ASTM D1003 Procedure B with instrument Macbeth (Xrite) 7000A, D65 illuminant, 10° observed, and with the specular component included and the UV component excluded. If the multilayer sheet has an engineered surface texture on its air side (i.e., the side of the multilayer sheet not adhered to the solar module), then the textured surface needs to be oriented facing to the light detector of the Macbeth instrument when being measured for light transmission. If the multilayer sheet has a flat surface on both sides, the orientation of the sheets does not matter when being measured for light transmission.

The sheets disclosed herein comprising a core layer and first cap layers, can provide desired properties for the sheet to be used in various electronic applications, including PV modules. The sheets have improved hydrolytic stability compared to backsheets comprising PET and potentially cost less to manufacture since the core layer and the cap layer can be formed and bonded in a one step co-extrusion process.

Shaped, formed, or molded articles comprising the compositions and sheets disclosed herein are also provided. The compositions can be molded into useful shaped articles by a variety of means such as injection molding, rotational molding, blow molding, and thermoforming to form articles such as, for example, computer and business machine housings such as housings for monitors, handheld electronic device housings such as housings for cell phones, insulation films, electrical connectors, and components of lighting fixtures, ornaments, home appliances, roofs, greenhouses, sun rooms, swimming pool enclosures, and so forth.

In one embodiment, a photovoltaic module comprises: a transparent superstrate; a backsheet, wherein the backsheet comprises a core layer comprising a core composition formed from a first polycarbonate comprising dimethyl bisphenol cyclohexane carbonate repeat units and bisphenol-A repeat units, wherein the first polycarbonate has the structure

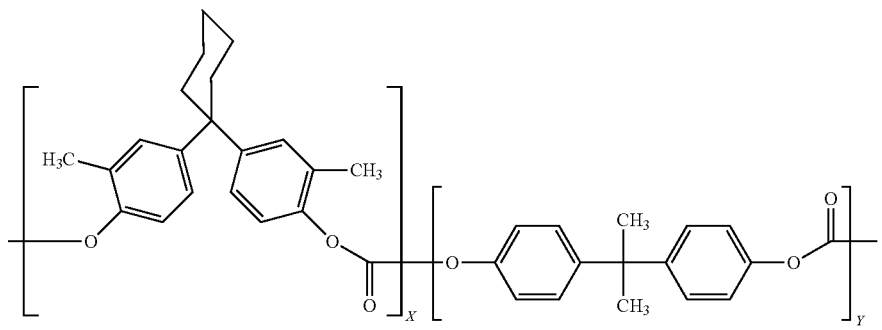

wherein the dimethyl bisphenol cyclohexane carbonate repeat units are present in an amount of 10 wt. % to 50 wt. %, based on the total repeat units in the core composition; and a second polycarbonate selected from the group consisting of a bisphenol-A polycarbonate homopolymer, a polyphthalate carbonate copolymer, a polycarbonate copolymer comprising 2-phenyl-3,3-bis(4-hydroxyphenyl) phthalimidine carbonate and bisphenol-A carbonate repeat units, a polycarbonate copolymer comprising bisphenol-A carbonate and tetrabromobisphenol A carbonate repeat units, and combinations comprising at least one of the foregoing; and a photovoltaic cell between the superstrate and the backsheet.

In another embodiment, a multilayer sheet comprises: a core layer formed from a core composition comprising a first polycarbonate comprising dimethyl bisphenol cyclohexane carbonate repeat units and bisphenol-A repeat units, wherein the first polycarbonate has the structure

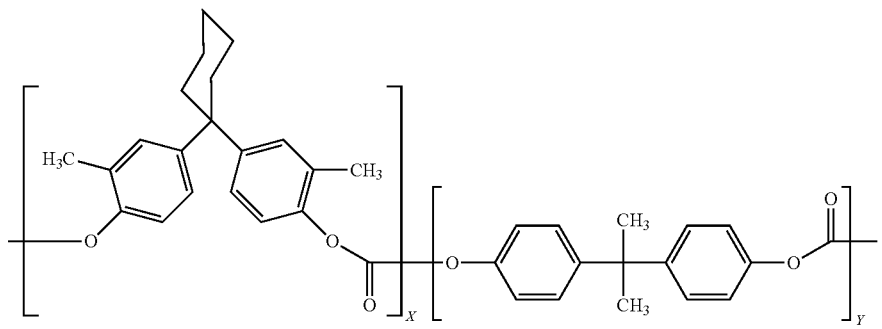

wherein the dimethyl bisphenol cyclohexane carbonate repeat units are present in an amount of 10 wt. % to 50 wt. %, based on the total repeat units in the core compositions; a second polycarbonate comprising a polyphthalate carbonate copolymer having the structure

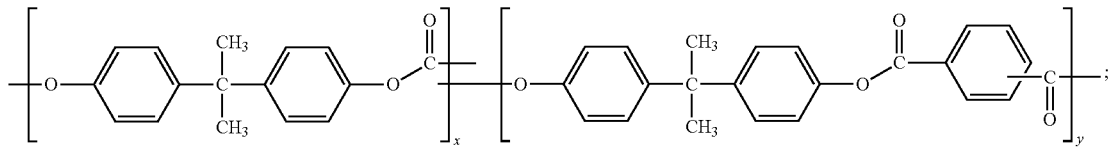

and a third polycarbonate comprising bisphenol-A polycarbonate homopolymer; and a first cap layer disposed on a surface of the core layer.

In an embodiment a composition comprises: a first polycarbonate comprising dimethyl bisphenol cyclohexane carbonate repeat units and bisphenol-A repeat units, wherein the first polycarbonate has the structure

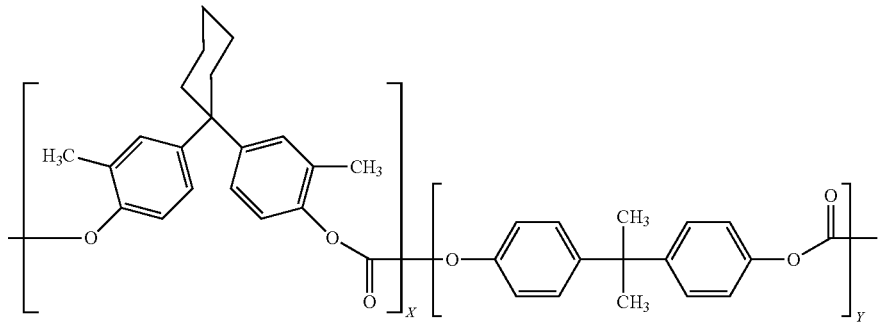

wherein the dimethyl bisphenol cyclohexane carbonate repeat units are present in an amount of 10 wt. % to 50 wt. %, based on the total repeat units in the composition; and a second polycarbonate comprising a polyphthalate carbonate copolymer having the structure

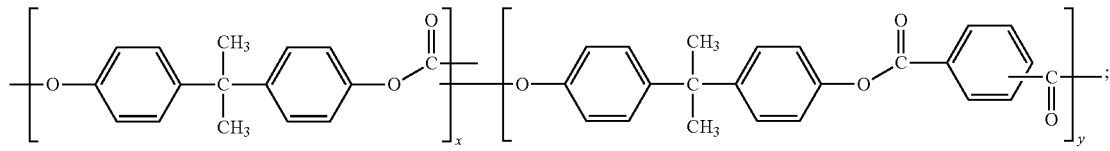

and a third polycarbonate comprising a bisphenol-A polycarbonate homopolymer.

In an embodiment, a method of making a multilayer sheet comprises: co-extruding a core layer and a first cap layer, wherein the core layer comprises a core composition comprising a first polycarbonate composition comprising dimethyl bisphenol cyclohexane carbonate repeat units and bisphenol-A repeat units, wherein the first polycarbonate has the structure

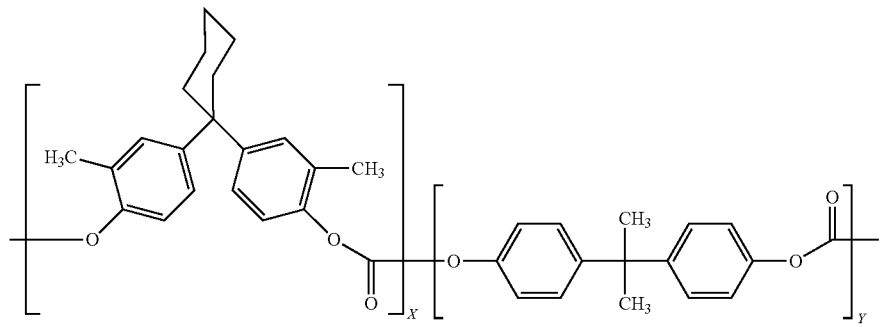

wherein the dimethyl bisphenol cyclohexane carbonate repeat units are present in an amount of 10 wt. % to 50 wt. %, based on the total repeat units in the core composition; a second polycarbonate comprising a polyphthalate carbonate copolymer having the structure

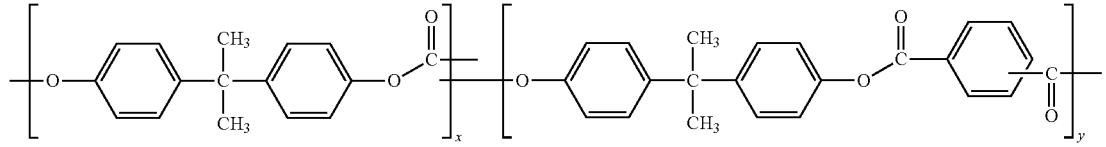

and a third polycarbonate comprising a bisphenol-A polycarbonate homopolymer; and wherein the first cap layer comprises a member selected from the group consisting of polycarbonate and a UV light absorbing stabilizer, a resorcinol polyarylate carbonate copolymer, and combinations comprising at least one of the foregoing.

In the various embodiments, (i) a first cap layer disposed on a surface of the core layer, wherein the first cap layer comprises polycarbonate and a UV light absorbing stabilizer is present; and/or (ii) the first cap layer comprises a resorcinol polyarylate carbonate copolymer; and/or (iii) a second cap layer is present, wherein the second cap layer comprises a member selected from the group consisting of polycarbonate, ethyl vinyl acetate copolymer with a vinyl acetate content of 2 wt. % to 10 wt. %, polyethylene, polypropylene, cyclic olefin copolymer, and combinations comprising at least one of the foregoing; and/or (iv) the second cap layer comprises a cyclic olefin copolymer and wherein an adhesive layer is disposed between the second cap layer and the core layer; and/or (v) wherein the second polycarbonate is present in an amount of 20 wt. % to 50 wt. %, and the third polycarbonate is present in an amount of 10 wt. % to 50 wt. %, based on a total weight of the composition of 100 wt. %; and/or (vi) the second polycarbonate is present in an amount of 40 wt. % to 50 wt. %, and the third polycarbonate is present in an amount of 10 wt. % to 25 wt. %, based on a total weight of the composition of 100 wt. %; and/or (vii) the thermal shrinkage is less than 1% along the machine direction and transverse direction after a thermal treatment at 150° C. for 30 minutes; and/or (viii) the sheet has greater than or equal to 30% retention of puncture resistance after a pressure cooker test at a temperature of 121° C., saturated water steam pressure of 1.2 bars, and 100% relative humidity for 72 hours; and/or (ix) the first cap layer comprises a member selected from the group consisting of polycarbonate and a UV light absorbing stabilizer, a resorcinol polyarylate carbonate copolymer, and combinations comprising at least one of the foregoing; and/or (x) a second cap layer is present, wherein the core layer is disposed between the first cap layer and the second cap layer, wherein the second cap layer comprises a material selected from the group consisting of bisphenol-A polycarbonate, polycarbonate copolymers, polyethylene, polypropylene, and combinations comprising at least one of the foregoing; and/or (xi) the first cap layer comprises a fluoropolymer selected from the group consisting of polyvinylflouride, polyvinylidene fluoride, polytetrafluoroethylene, ethylene-tetrafluoroethylene copolymer, polychlorotrifluoroethylene, ethylene-chlorofluoroethylene copolymer, tetrafluoroethylene hexafluorpropylene vinylidenefluoride, and combinations comprising at least one of the foregoing; and/or (xii) the second polycarbonate is present in an amount of 20 wt. % to 50 wt. %, and the third polycarbonate is present in an amount of 0 wt. % to 40 wt. %, based on a total weight of the composition of 100 wt. %; and/or (xiii) a second cap layer comprising polycarbonate is co-extruded, wherein the core layer is disposed between the first cap layer and the second cap layer; and/or (xiv) a second cap layer comprising a polyolefin is laminated to the core layer, wherein an adhesive layer is disposed between the core layer and the second cap layer, and wherein the core layer is disposed between the first cap layer and the adhesive layer; and/or (xv) an article, wherein the article is selected from the group consisting of housings for monitors, housings for cell phones, insulation films, electrical connectors, components of lighting fixtures, ornaments, home appliances, roofs, greenhouses, sun rooms, and swimming pool enclosures.

All ranges disclosed herein are inclusive of the endpoints, and the endpoints are independently combinable with each other (e.g., ranges of "up to 25 wt. %, or, more specifically, 5 wt. % to 20 wt. %", is inclusive of the endpoints and all intermediate values of the ranges of "5 wt. % to 25 wt. %," etc.). "Combination" is inclusive of blends, mixtures, alloys, reaction products, and the like. Furthermore, the terms "first," "second," and the like, herein do not denote any order, quantity, or importance, but rather are used to differentiate one element from another. The terms "a" and "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the film(s) includes one or more films). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. "Optional" or "optionally" means that the subsequently described event or circumstance can or cannot occur, and that the description includes instances where the event occurs and instances where it does not.

Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, —CHO is attached through carbon of the carbonyl group. In addition, it is to be understood that the described elements may be combined in any suitable manner in the various embodiments.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A multilayer sheet, comprising:
   a core layer formed from a core composition comprising
   a first polycarbonate comprising dimethyl bisphenol cyclohexane carbonate repeat units (X) and bisphenol-A carbonate repeat units (Y), where the first polycarbonate has the structure

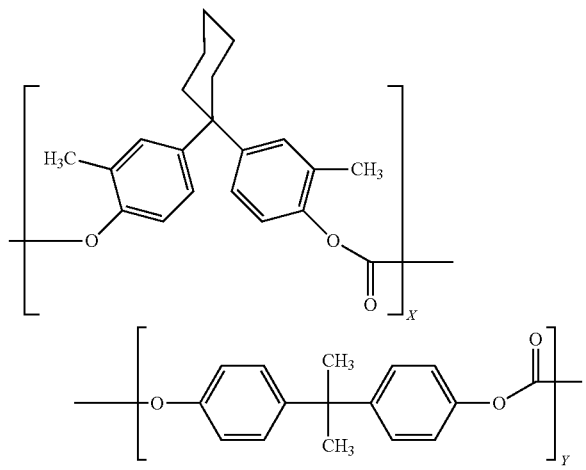

wherein the dimethyl bisphenol cyclohexane carbonate repeat units are present in an amount of 10 wt. % to 40 wt. %, based on the total repeat units in the core composition;
a second polycarbonate comprising a polyphthalate carbonate copolymer comprising a bisphenol-A carbonate block (x) and an aromatic ester block (y) having the structure and

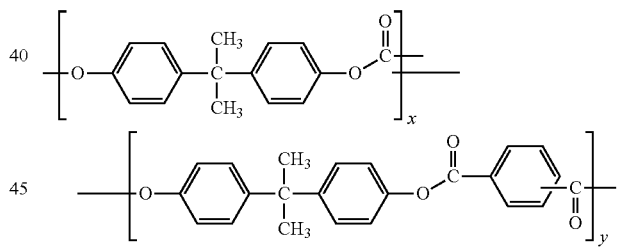

wherein the second polycarbonate does not comprise an isophthalate bisphenol-A ester block; and
a third polycarbonate comprising a bisphenol-A polycarbonate homopolymer; and
a first cap layer disposed on a surface of the core layer; wherein the multilayer sheet is hydrothermally stable.

2. The multilayer sheet of claim 1, wherein the second polycarbonate is present in an amount of 20 wt. % to 50 wt. %, and the third polycarbonate is present in an amount of 10 wt. % to 50 wt. %, based on a total weight of the composition of 100 wt. %.

3. The multilayer sheet of claim 2, wherein the second polycarbonate is present in an amount of 40 wt. % to 50 wt. %, and the third polycarbonate is present in an amount of 10 wt. % to 25 wt. %, based on a total weight of the composition of 100 wt. %.

4. The multilayer sheet of claim 1, wherein the thermal shrinkage of the multilayer sheet is less than 1% along the machine direction and the transverse direction after a thermal treatment at 150° C. for 30 minutes.

5. The multilayer sheet of claim 1, wherein the sheet has greater than or equal to 30% retention of puncture resistance after a pressure cooker test at a temperature of 121° C., saturated water steam pressure of 1.2 bars, and 100% relative humidity for 72 hours.

6. The multilayer sheet of claim 1, wherein the first cap layer comprises at least one of a polycarbonate and a UV light absorbing stabilizer, or a resorcinol polyarylate carbonate copolymer.

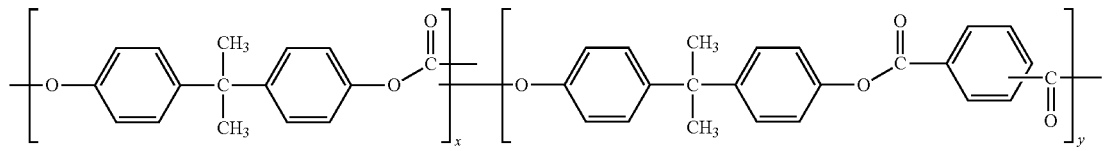

7. The multilayer sheet of claim 1, further comprising a second cap layer, wherein the core layer is disposed between the first cap layer and the second cap layer, wherein the second cap layer comprises at least one of bisphenol-A polycarbonate, polycarbonate copolymers, polyethylene, or polypropylene.

8. The multilayer sheet of claim 1, wherein the first cap layer comprises a fluoropolymer selected from the group consisting of polyvinylfluoride, polyvinylidene fluoride, polytetrafluoroethylene, ethylene-tetrafluoroethylene copolymer, polychlorotrifluoroethyelene, ethylene-chlorotrifluoroethylene copolymer, tetrafluoroethylene hexafluoropropylene vinylidenefluoride, and combinations thereof.

9. The multilayer sheet of claim 1, wherein the sheet has a thermal shrinkage of less than or equal to 3%.

10. The multilayer sheet of claim 1, wherein the sheet has a water vapor transmission rate of less than or equal to 15 g/m²–24 hour.

11. The multilayer sheet of claim 1, wherein the sheet passes a minimum of 1,000 hours of a damp heat test at conditions of 85° C. and 85% relative humidity.

12. The multilayer sheet of claim 1, wherein the multilayer sheet has a retention of puncture resistance after environmental exposure of greater than or equal to 50%.

13. The multilayer sheet of claim 12, wherein the retention of puncture resistance after environmental exposure is greater than or equal to 60%.

14. A method of making a multilayer sheet, comprising:
co-extruding a core layer and a first cap layer, wherein the core layer comprises a core composition comprising
a first polycarbonate comprising dimethyl bisphenol cyclohexane carbonate repeat units (X) and bisphenol-A carbonate repeat units (Y), wherein the first polycarbonate has the structure wherein the dimethyl bisphenol cyclohexane carbonate repeat units are present in an amount of 10 wt. % to 40 wt. %, based on the total repeat units in the core composition;

a second polycarbonate comprising a polyphthalate carbonate copolymer comprising a bisphenol-A carbonate block (x) and an aromatic ester block (y) having the structure

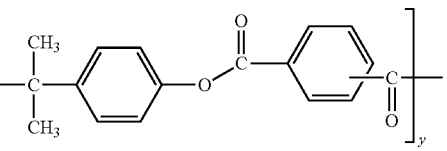

wherein the second polycarbonate does not comprise an isophthalate bisphenol-A ester block; and a third polycarbonate comprising a bisphenol-A polycarbonate homopolymer; and wherein the first cap layer is disposed on a surface of the core layer and wherein the first cap layer comprises a member selected from the group consisting of polycarbonate and a UV light absorbing stabilizer, a resorcinol polyarylate carbonate copolymer, and combinations thereof;

wherein the multilayer sheet is hydrothermally stable.

15. The method of claim 14, further comprising co-extruding a second cap layer comprising polycarbonate, wherein the core layer is disposed between the first cap layer and the second cap layer.

16. The method of claim 14, further comprising laminating a second cap layer comprising a polyolefin to the core layer, wherein an adhesive layer is disposed between the core layer and the second cap layer, and wherein the core layer is disposed between the first cap layer and the adhesive layer.

17. A photovoltaic module, comprising:
a transparent superstrate;
a backsheet, wherein the backsheet comprises a core layer comprising a core composition comprising a first polycarbonate comprising dimethyl bisphenol cyclohexane carbonate repeat units (X) and bisphenol-A carbonate repeat units (Y), wherein the first polycarbonate has the structure

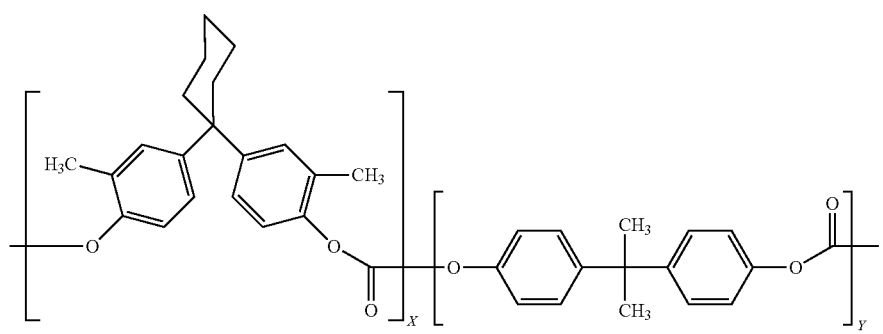

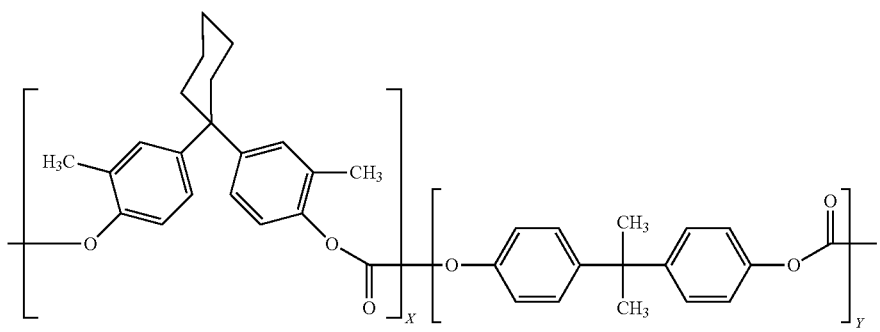

wherein the dimethyl bisphenol cyclohexane carbonate repeat units are present in an amount of 10 wt. % to 40 wt. %, based on the total repeat units in the core composition;

a second polycarbonate comprising a polyphthalate carbonate copolymer comprising a bisphenol-A carbonate block (x) and an aromatic ester block (y) having the structure

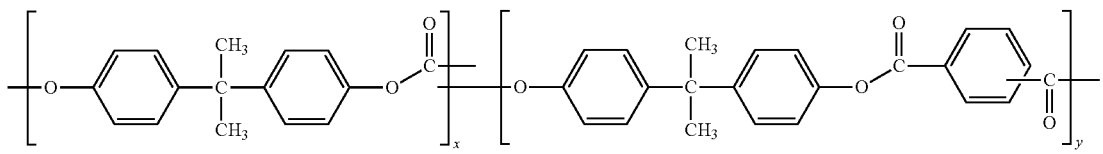

wherein the second polycarbonate does not comprise an isophthalate bisphenol-A ester block; and a third polycarbonate comprising a bisphenol-A polycarbonate homopolymer; and a first cap layer disposed on a surface of the core layer; and a photovoltaic cell between the superstrate and the backsheet;

wherein the backsheet is hydrothermally stable.

18. The photovoltaic module of claim 17, wherein the first cap layer comprises polycarbonate and a UV light absorbing stabilizer.

19. The photovoltaic module of claim 18, further comprising a second cap layer, wherein the core layer is disposed between the first cap layer and the second cap layer, wherein the second cap layer comprises a member selected from the group consisting of polycarbonate, ethylene vinyl acetate copolymer with a vinyl acetate content of 2 wt. % to 10 wt. %, polyethylene, polypropylene, cyclic olefin copolymer, and combinations thereof.

* * * * *